US008569878B2

(12) United States Patent
Sasaki et al.

(10) Patent No.: US 8,569,878 B2
(45) Date of Patent: Oct. 29, 2013

(54) SEMICONDUCTOR SUBSTRATE, LAMINATED CHIP PACKAGE, SEMICONDUCTOR PLATE AND METHOD OF MANUFACTURING THE SAME

(75) Inventors: Yoshitaka Sasaki, Milpitas, CA (US);
Hiroyuki Ito, Milpitas, CA (US);
Atsushi Iijima, Shatin (HK)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 549 days.

(21) Appl. No.: 12/588,659

(22) Filed: Oct. 22, 2009

(65) Prior Publication Data

US 2011/0095414 A1    Apr. 28, 2011

(51) Int. Cl.
*H01L 23/52*  (2006.01)
*H01L 23/48*  (2006.01)
*H01L 21/60*  (2006.01)

(52) U.S. Cl.
USPC .... 257/692; 257/773; 257/690; 257/E21.509; 257/E23.01; 257/E23.141; 438/121

(58) Field of Classification Search
USPC ....................................................... 257/692
See application file for complete search history.

(56) References Cited

U.S. PATENT DOCUMENTS

| 5,953,588 | A | 9/1999 | Camien et al. |
| 7,127,807 | B2 | 10/2006 | Yamaguchi et al. |
| 2002/0047210 | A1* | 4/2002 | Yamada et al. ............... 257/774 |
| 2005/0199979 | A1* | 9/2005 | Shimoishizaka et al. ..... 257/528 |
| 2010/0044879 | A1* | 2/2010 | Sasaki et al. .................. 257/777 |

OTHER PUBLICATIONS

Gann; "Neo-Stacking Technology;" *HDI Magazine*; Dec. 1999; 4 pp.

* cited by examiner

*Primary Examiner* — Jarrett Stark
*Assistant Examiner* — Lawrence Tynes, Jr.
(74) *Attorney, Agent, or Firm* — Oliff & Berridge, PLC

(57) ABSTRACT

A semiconductor substrate has a plurality of groove portions formed along scribe lines. The semiconductor substrate includes: a device region in contact with at least any one of the plurality of groove portions and having a semiconductor device formed therein; a surface insulating layer formed to cover the device region and constituting a surface layer of the semiconductor substrate; and a wiring electrode connected to the semiconductor device and formed in a protruding shape rising above a surface of the surface insulating layer. The semiconductor substrate can be manufactured by forming a plurality of groove portions along scribe lines; applying an insulating material to a surface on a side where the plurality of groove portions are formed to form a surface insulating layer; and forming a wiring electrode connected to the semiconductor device and in a protruding shape rising above a surface of the surface insulating layer, after the formation of the surface insulating layer.

10 Claims, 25 Drawing Sheets

US 8,569,878 B2

SEMICONDUCTOR SUBSTRATE, LAMINATED CHIP PACKAGE, SEMICONDUCTOR PLATE AND METHOD OF MANUFACTURING THE SAME

BACKGROUND

1. Field of the Invention

The present invention relates to a semiconductor substrate for manufacturing a laminated chip package including a plurality of laminated chips, a laminated chip package, a semiconductor plate, and a method of manufacturing the same.

2. Related Background Art

In recent years, electronic devices such as cellular phones and notebook personal computers need to be reduced in weight and improved in performance. With such needs, higher integration of electronic components used for the electronic devices has been required. Further, the higher integration of electronic components has been required also for increase in capacity of a semiconductor memory device.

Recently, System in Package (hereinafter referred to as a "SIP") has attracted attention as a highly integrated electronic component. The SIP is a device created by stacking a plurality of LSIs and mounting them in one package, and a SIP using the three-dimensional mounting technique of laminating a plurality of chips has received attention recently. Known as such a SIP is a package having a plurality of laminated chips, that is, a laminated chip package. The laminated chip package has an advantage that speed up of operation of circuits and reduction in stray capacitance of wiring become possible because the length of the wiring can be reduced as well as an advantage of capability of high integration.

Known as the three-dimensional mounting techniques for manufacturing the laminated chip package include a wire bonding system and a through electrode system. The wire bonding system is a system of laminating a plurality of chips on a substrate and connecting a plurality of electrodes formed on each of the chips and external connecting terminals formed on the substrate by wire bonding. The through electrode system is a system of forming a plurality of through electrodes in each of the laminated chips and realizing wiring between the chips by the through electrodes.

The wire bonding system has a problem of a difficulty in reducing the spaces between the electrodes in a manner that the wires are not in contact with each other, a problem of a difficulty in speeding up the operation of circuits because of a high resistance value of wires, and a problem of a difficulty in reducing the thickness.

Though the above-described problems in the wire bonding system are solved in the through electrode system, the through electrode system has a problem of increased cost of the laminated chip package because many processes are required for forming the through electrodes in each of the chips.

Conventionally known methods of manufacturing the laminated chip package are those disclosed, for example, in U.S. Pat. Nos. 5,953,588 and 7,127,807 B2, for example. In U.S. Pat. No. 5,953,588, the following manufacturing method is described. In this manufacturing method, first, a plurality of chips cut out of a wafer are embedded in an embedding resin. Then, a plurality of leads to be connected to the chips are formed to create a structure called Neo-Wafer. Subsequently, the Neo-Wafer is cut to create a plurality of structures called Neo-chips each including the chip, the resin surrounding the chip, and the plurality of leads. In this event, end faces of the plurality of leads connected to the chips are exposed on side surfaces of the Neo-chips. Then, a plurality of kinds of Neo-chips are laminated to create a laminated body. In this laminated body, the end faces of the plurality of leads connected to the chips at the respective layers are exposed on the same side surface of the laminated body.

Keith D. Gann, "Neo-Stacking Technology", HDI Magazine, December, 1999 describes that a laminated body is formed by the same method as the manufacturing method described in U.S. Pat. No. 5,953,588 and wiring is formed on two side surfaces of the laminated body.

On the other hand, U.S. Pat. No. 7,127,807 B2 discloses a multilayer module which is configured by laminating a plurality of active layers made by forming one or more electronic elements and a plurality of conductive traces on a flexible polymer substrate.

SUMMARY OF THE INVENTION

Incidentally, the laminated chip package is manufactured by the following procedure. First, a wafer (a device wafer) having a plurality of devices formed therein is created by performing wafer process. Then, a plurality of groove portions along scribe lines are formed in the device wafer. Further, a resin such as an epoxy resin, a polyimide resin or the like is embedded in the groove portions to form insulating layers to thereby create a grooved device wafer. Such grooved device wafers are bonded together with an insulating adhesive to create a laminated device wafer. The laminated device wafer is cut along the groove portions to manufacture laminated chip packages.

Meanwhile, in the laminated chip package, a plurality of device plates are stacked one on the other. When the laminated device wafer is cut along the groove portions, the grooved device wafers are also cut along the groove portions. Members in a plate shape formed by cutting the grooved device wafer along the groove portions are the device plates.

In order to manufacture the laminated chip package, the device plates need to be electrically connected with each other. Each of the device plates has a plurality of devices formed therein and side surfaces covered by an insulating layer. Therefore, the following 1) and 2) processes have been conventionally required for the manufacturing process of the laminated chip package. Specifically, 1) assuming that a structure in which device plates are stacked in the vertical direction is a device block, end faces of wirings formed in the device plates are made to appear at one side surface of the device block. 2) Then, secondary wirings (also referred to as connection electrodes) connecting the end faces of the wirings across each of the device plates are formed on the side surface of the device block.

However, the size of the end face of the wiring appearing at each of the device plates is very small, and the secondary wiring needs to be formed such that all of the end faces arranged in the vertical direction are linked together. To this end, when a mask pattern for forming the secondary wiring is formed in the above-described 2) process, positions need to be accurately adjusted and therefore the alignment needs to be performed with high accuracy. Accordingly, it has been difficult to simplify the manufacturing process of the laminated chip package and reduce the manufacturing time.

The present invention is made to solve the above problem, and it is an object to provide a semiconductor substrate including a structure which can be used to simplify the manufacturing process of a laminated chip package and reduce the manufacturing time, a laminated chip package and a semiconductor plate using the semiconductor substrate, and a method of manufacturing the same.

To solve the above problem, the present invention is a semiconductor substrate having a plurality of groove portions formed along scribe lines, including: a device region in contact with at least any one of the plurality of groove portions and having a semiconductor device formed therein; a surface insulating layer formed to cover the device region and constituting a surface layer of the semiconductor substrate; and a wiring electrode connected to the semiconductor device and formed in a protruding shape rising above a surface of the surface insulating layer.

In the semiconductor substrate, the section of the wiring electrode is formed to project from the surface of the surface insulating layer and have an increased size.

In the above-described semiconductor substrate, the surface insulating layer is structured integrally with an in-groove insulating portion formed inside the groove portion, and the wiring electrode can be structured to have an extended terminal portion extended from the device region to an inside of the groove portion and formed in a protruding shape rising above a surface of the in-groove insulating portion.

In the semiconductor substrate, the wiring electrode has the extended terminal portion, so that the end face of the wiring electrode can be made to appear at the cut surface when the semiconductor substrate is cut along the groove portion.

Further, the wiring electrode can be structured to have a cross side surface projecting outward from the surface of the surface insulating layer and crossing with the surface of the surface insulating layer, a top end face projecting outward from the surface of the surface insulating layer and disposed along the surface of the surface insulating layer, and an embedded portion embedded inward from the surface of the surface insulating layer.

Further, the extended terminal portion can also be structured to have a cross side surface projecting outward from the surface of the surface insulating layer and crossing with the surface of the surface insulating layer, and a top end face projecting outward from the surface of the surface insulating layer and disposed along the surface of the surface insulating layer.

Further, it is preferable that the above-described semiconductor substrate has a connecting pad connected to the semiconductor device; and a protecting insulating layer having a connecting hole formed at a position for forming the connecting pad, the protecting insulating layer being disposed under the surface insulating layer and formed to cover the device region, wherein the wiring electrode has an electrode pad having an expanded height from a side outer than the surface of the surface insulating layer to the connecting pad.

Further, it is also possible that an end face of the wiring electrode appears projecting outward from the surface of the surface insulating layer at a cut surface when the semiconductor substrate is cut along at least any one of the plurality of groove portions.

Further, it is preferable that a plurality of the wiring electrodes are arranged along at least any one of the plurality of groove portions and form a wiring electrode group having an unevenly distributed structure in which the respective extended terminal portions thereof are unevenly extended at a part of all of the groove portions in contact with the device region.

Further, the present invention provides a laminated chip package in which a plurality of semiconductor plates including a first semiconductor plate having a first semiconductor device formed therein and a second semiconductor plate having a second semiconductor device formed therein are laminated, wherein the first semiconductor plate includes: a first surface insulating layer formed to cover the first semiconductor device and constituting a surface layer of the laminated chip package; and a first wiring electrode connected to the first semiconductor device and formed in a protruding shape rising above a surface of the first surface insulating layer, an end face of the first wiring electrode being formed as a first projecting end face projecting outward from the surface of the first surface insulating layer, and wherein the second semiconductor plate is laminated under the first semiconductor plate.

In this laminated chip package, the first wiring electrode has a cross side surface projecting outward from the surface of the first surface insulating layer and crossing with the surface of the first surface insulating layer, a top end face projecting outward from the surface of the first surface insulating layer and disposed along the surface of the first surface insulating layer, and an embedded portion embedded inward from the surface of the first surface insulating layer.

The second semiconductor plate can also be structured to include: a second surface insulating layer formed to cover the second semiconductor device; and a second wiring electrode connected to the second semiconductor device and formed in a protruding shape rising above a surface of the second surface insulating layer, an end face of the second wiring electrode being formed below the first projecting end face as a second projecting end face projecting outward from the surface of the second surface insulating layer, and to be laminated under the first semiconductor plate via an adhesive layer covering the second surface insulating layer and the second wiring electrode.

It is preferable that the above-described laminated chip package further includes a connection electrode connecting the first projecting end face and the second projecting end face.

Further, the present invention provides a semiconductor plate having a semiconductor device formed therein, including: a surface insulating layer formed to cover the semiconductor device and constituting a surface layer of the semiconductor plate; and a wiring electrode connected to the semiconductor device and formed in a protruding shape rising above a surface of the surface insulating layer, wherein an end face of the wiring electrode appears as a projecting end face projecting outward from the surface of the surface insulating layer at least one of side surfaces.

In the above-described semiconductor plate, the wiring electrode can be structured to have a cross side surface projecting outward from the surface of the surface insulating layer and crossing with the surface of the surface insulating layer, a top end face projecting outward from the surface of the surface insulating layer and disposed along the surface of the surface insulating layer, and an embedded portion embedded inward from the surface of the surface insulating layer.

Further, the semiconductor plate can be structured to further include: a connecting pad connected to the semiconductor device; and a protecting insulating layer having a connecting hole formed at a position for forming the connecting pad, the protecting insulating layer being disposed under the surface insulating layer and formed to cover the semiconductor device, wherein the wiring electrode has an electrode pad having an expanded height from a side outer than the surface of the surface insulating layer to the connecting pad.

Further, it is possible that the semiconductor plate is formed in a rectangular-plate shape as a whole, only any one set of opposite side surfaces of two sets of opposite side surfaces of the plate shape portion are covered by the surface insulating layer, and the projecting end face appears at least any one of the opposite side surfaces of the one set.

Further, it is possible that the semiconductor plate is formed in a rectangular-plate shape as a whole, and only one side surface of four side surfaces of the plate shape portion is covered by the surface insulating layer and having the projecting end face appearing thereat.

Further, the present invention provides a method of manufacturing a semiconductor substrate to manufacture a semiconductor substrate, including the steps of: for an unprocessed substrate having a semiconductor device formed therein, forming a plurality of groove portions along scribe lines; applying an insulating material to a surface on a side where the plurality of groove portions are formed to form a surface insulating layer; and forming a wiring electrode connected to the semiconductor device and in a protruding shape rising above a surface of the surface insulating layer, after the formation of the surface insulating layer.

In the manufacturing method, it is preferable that when forming the wiring electrode, an extended terminal portion in a protruding shape rising above a surface of an in-groove insulating portion formed inside the groove portion is formed.

Further, it is preferable that when forming the wiring electrode, a plurality of the wiring electrodes are arranged along the groove portion and a wiring electrode group is formed, the wiring electrode group having an unevenly distributed structure in which the respective extended terminal portions thereof are unevenly extended at a part of all of the groove portions in contact with the device region.

Further, the present invention provides a method of manufacturing a laminated chip package, including the steps of: laminating at least two semiconductor substrates manufactured by the disclosed manufacturing method to form a laminated device wafer; making end faces of the wiring electrodes formed on the semiconductor substrates appear as projecting end faces projecting outward from a surface of the surface insulating layer at a cut surface when the laminated device wafer is cut along the groove portions to manufacture a device block; and forming a connection electrode connecting the projecting end faces is formed on the cut surface of the device block.

It is possible that when forming the laminated device wafer, a base and as adhesive used for fixing an uppermost substrate disposed on an uppermost tier among the semiconductor substrates are removed to make the wiring electrode on the uppermost substrate appear in a protruding shape rising above the surface of the surface insulating layer.

The present invention will be more fully understood from the detailed description given hereinbelow and the accompanying drawings which are given by way of illustration only, and thus are not to be considered as limiting the present invention.

DESCRIPTION OF THE PREFERRED EMBODIMENTS

In the following, embodiments of the present invention will be described with reference to the drawings. Note that the same components will be referred to with the same numerals or letters, while omitting their overlapping descriptions.

First Embodiment

Structures of Semiconductor Wafer

To begin with, the structure of a semiconductor wafer 1 that is an example of a semiconductor substrate according to embodiments of the present invention will be described with reference to FIG. 1 to FIG. 3.

Figure 1:
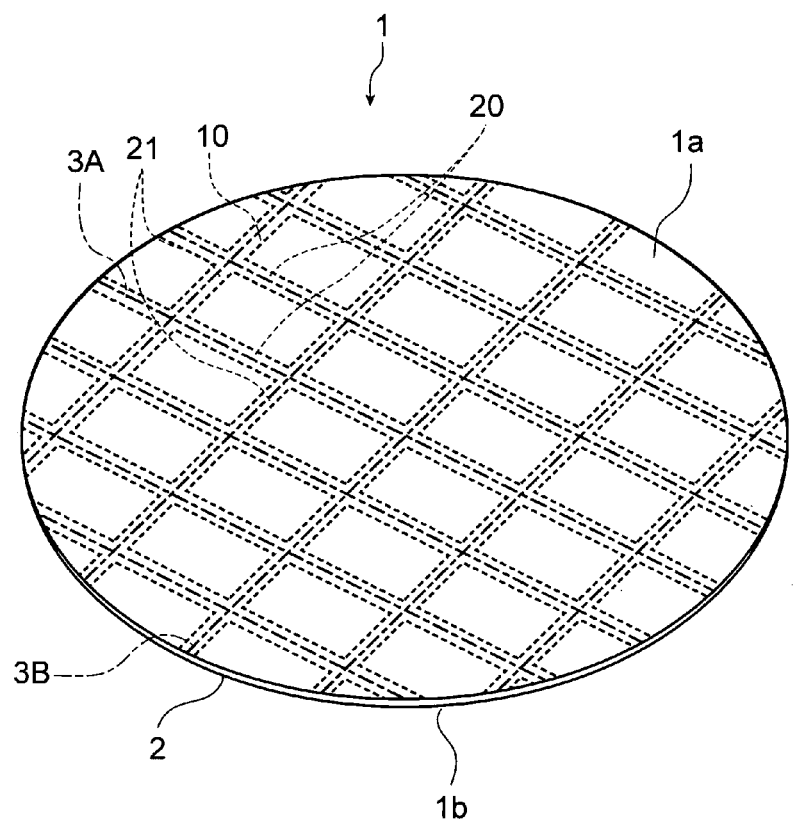
FIG. 1 is a perspective view illustrating the entire semiconductor wafer according to a first embodiment of the present invention.

FIG. 1 is a perspective view illustrating the whole semiconductor wafer 1 according to the first embodiment of the present invention. FIG. 2 is a plan view illustrating a device region 10 and a region surrounding it formed in the semiconductor wafer 1, and FIG. 3 is a sectional view taken along the line 3-3 in FIG. 2.

The semiconductor wafer 1 is composed using a silicon wafer 2. The semiconductor wafer 1 has, as illustrated in FIG. 1, scribe lines 3A and 3B formed on a first surface 1a of the silicon wafer 2 (the rear surface side of the first surface 1a is a second surface 1b). A plurality of each of the scribe lines 3A and 3B are formed on the first surface 1a and formed on straight lines at predetermined intervals along certain directions, respectively. The scribe lines 3A are orthogonal to the scribe lines 3B. The later-described device region 10 is formed within a region surrounded by the adjacent scribe lines 3A, 3A and 3B, 3B.

The semiconductor wafer 1 further has groove portions 20 and 21 formed in the first surface 1a. The groove portions 20 and 21 are formed along the scribe lines 3A and 3B, respectively, and each of them has a depth of about 20 to 60 μm and a width of about 50 to 120 μm.

Figure 3:
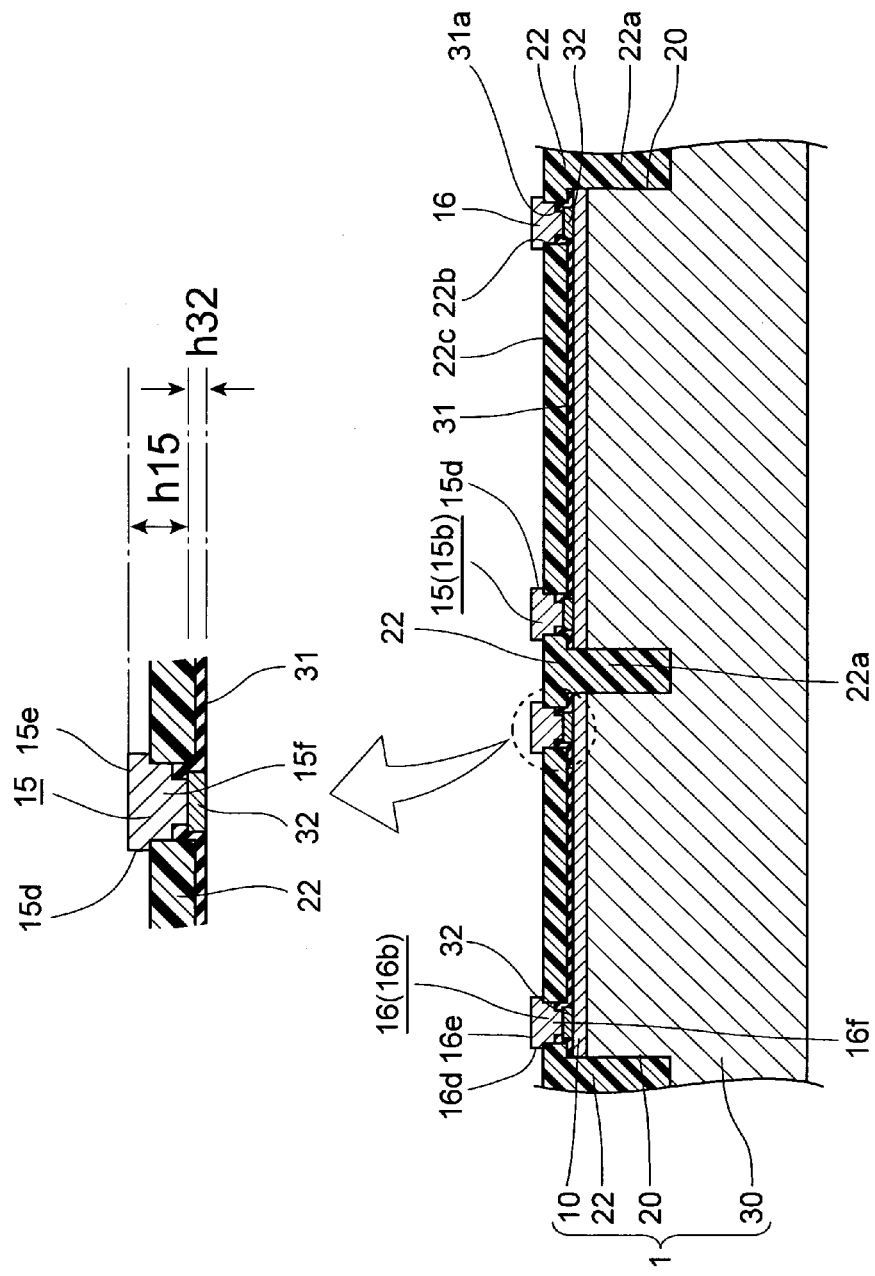
FIG. 3 is a sectional view taken along the line 3-3 in FIG. 2.

The semiconductor wafer 1 has a surface insulating layer 22 as illustrated in detail in FIG. 3. The surface insulting layer 22 is formed to cover the device region 10, and thus the surface insulting layer 22 covers almost the whole first surface 1a of the semiconductor wafer 1 to constitute a surface layer of the semiconductor wafer 1. The surface insulating layer 22 has a larger thickness than that of a later-described protecting insulating layer 31 and has a surface 22c formed flat, and is disposed at the outermost position of the semiconductor wafer 1 except for portions where later-described wiring electrodes 15 and wiring electrodes 16 are formed.

Further, the surface insulating layer 22 is structured integrally with in-groove insulating portions 22a formed inside the groove portions 20 and 21, and is thus formed in one body without joints between the in-groove insulating portions 22a and other portions. The surface insulating layer 22 is formed with a plurality of contact holes 22b, and one wiring electrode 15 or one wiring electrode 16 is formed in each of the contact holes 22b.

The surface insulating layer 22 can be formed using a resin such as an epoxy resin or a polyimide resin, or an insulating material made of silicon silicate glass (SOG) or the like. In this embodiment, a case using a resin for the surface insulating layer 22 is discussed. It is especially preferable to form the surface insulating layer 22 using a resin having a low thermal expansion coefficient. This ensures that when the semiconductor wafer 1 is cut along the groove portions 20 and 21 by a dicing saw, the cutting can be easily performed.

The semiconductor wafer 1 has a silicon substrate 30 composed of the silicon wafer 2, and upper portions thereof are the device regions 10. A plurality of connecting pads 32 are formed on the surface of the device region 10, and a portion other than the connecting pads 32 is covered with the protecting insulating layer 31.

The protecting insulating layer 31 is disposed under the surface insulating layer 22 and formed to cover the device region 10. The protecting insulating layer 31 is made of silicon dioxide ($SiO_2$) or the like, and has connecting holes 31a formed at positions where the connecting pads 32 are to be formed. The connecting holes 31a are formed to expose the connecting pads 32 so as to connect the later-described wiring electrodes 15 and 16 to the connecting pads 32. The connecting pads 32 are connected to the semiconductor device in the device region 10 (see FIG. 4 for details).

Figure 2:
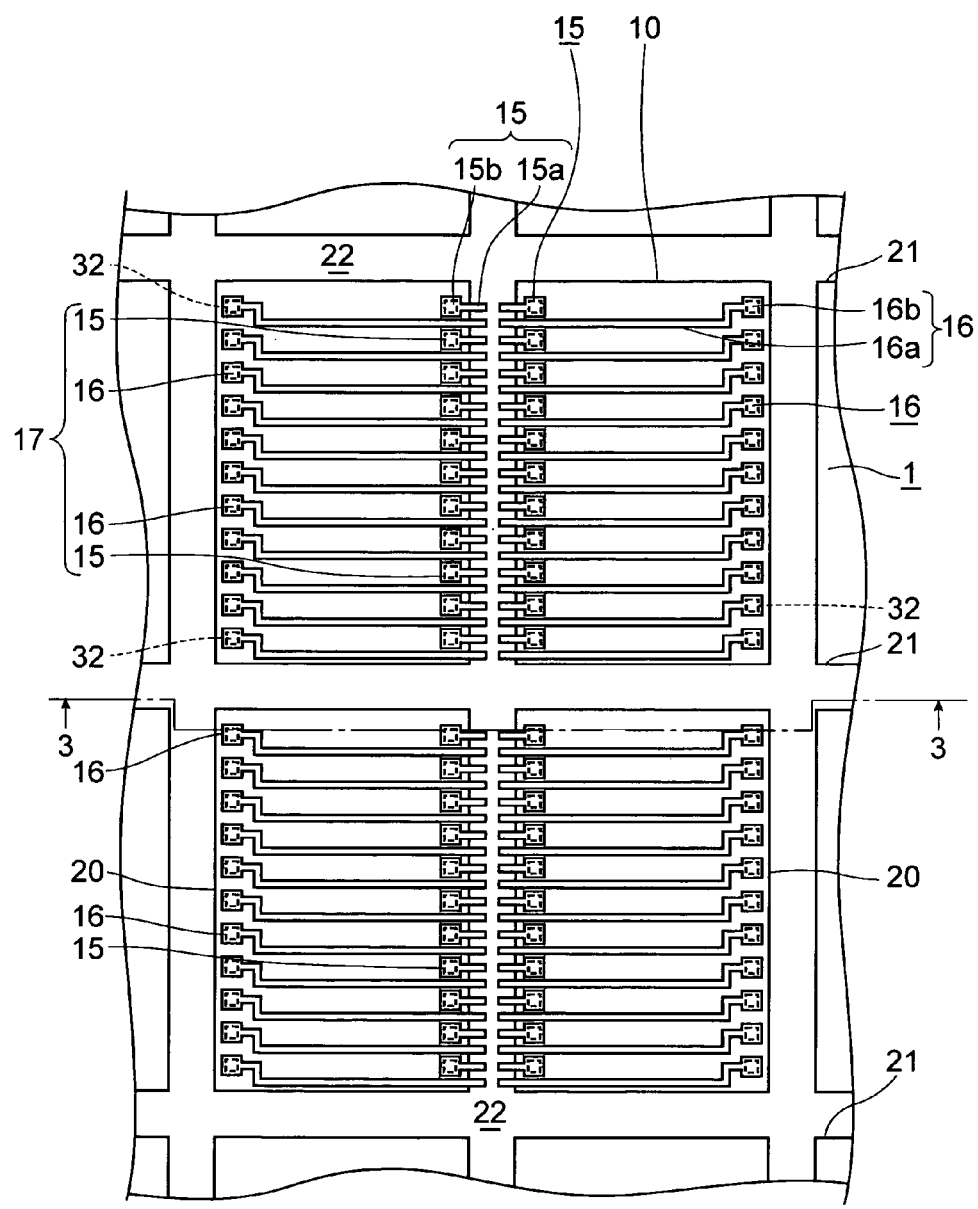
FIG. 2 is a plan view illustrating a device region and a region surrounding it formed in the semiconductor wafer.

The device region 10 is a rectangular region surrounded by the adjacent groove portions 20 and 20 and the groove portions 21 and 21 as illustrated in detail in FIG. 2. A plurality of the device regions 10 are formed on the first surface 1a, and each of them is a unit region divided from adjacent regions by the groove portions 20 and 21.

Each of the device regions 10 has the memory portion formed on the first surface 1a by performing wafer process, and a plurality of wiring electrodes 15 and 16 are formed. Note that the wafer process means a manufacturing process of forming a semiconductor element and an integrated circuit on the wafer such as the silicon wafer 2 or the like.

In addition to the memory portion, an integrated circuit and a semiconductor element such as a CPU, a sensor, a drive circuit for the sensor may be formed as the semiconductor devices within the device region 10. Further, a memory portion and an integrated circuit constituting a controller for controlling the memory portion may be formed in the device region 10.

The wiring electrode 15 is made of a conductive material such as Cu or the like. The wiring electrode 15 has an extended terminal portion 15a and a rectangular electrode pad 15b, and the extended terminal portion 15a and the rectangular electrode pad 15b have, as a whole, a protruding structure rising above the surface 22c of the surface insulating layer 22 into a three-dimensional shape.

Figure 15:
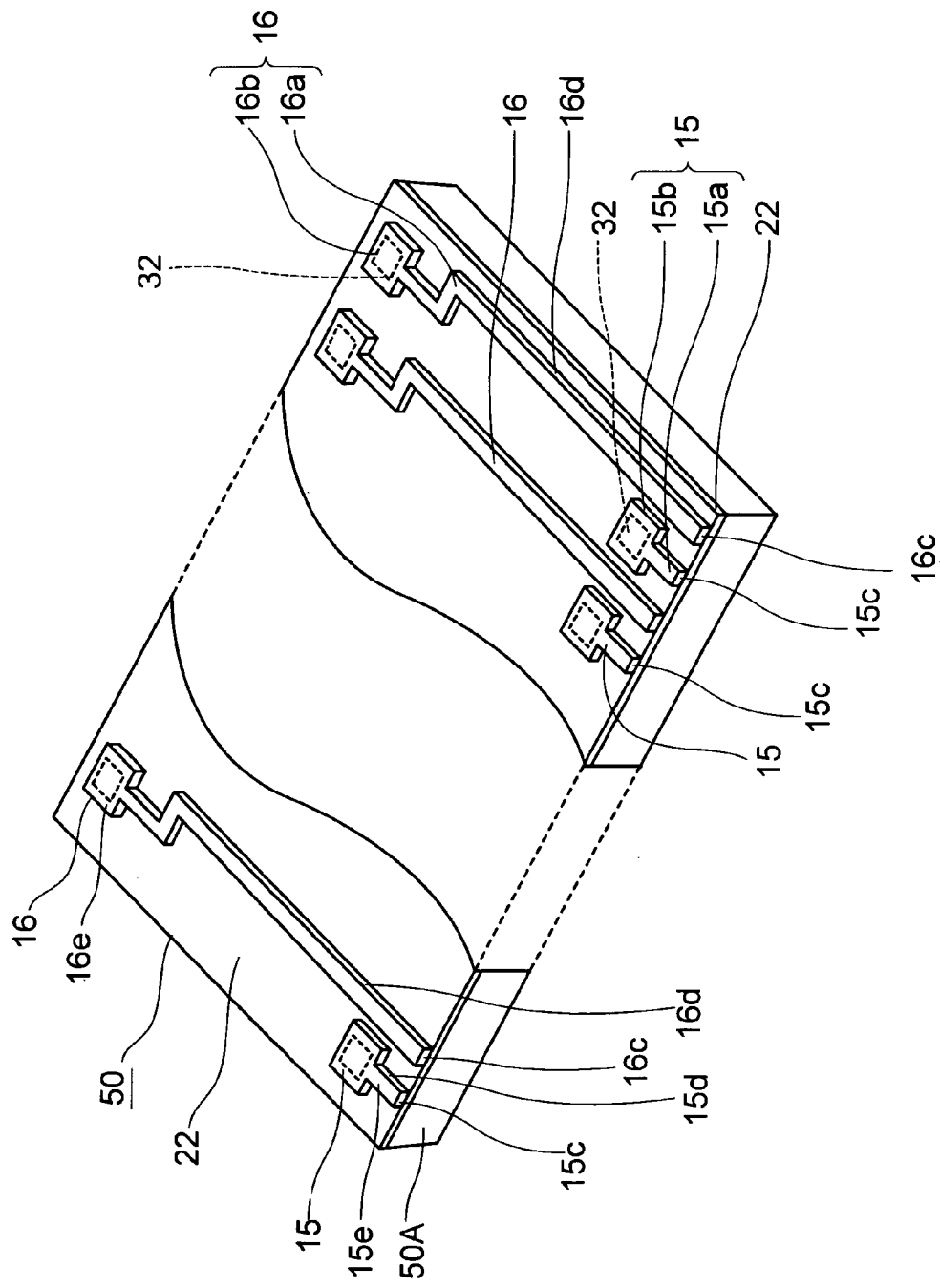
FIG. 15 is a perspective view illustrating an example of a device plate constituting the laminated chip package.
Figure 25:
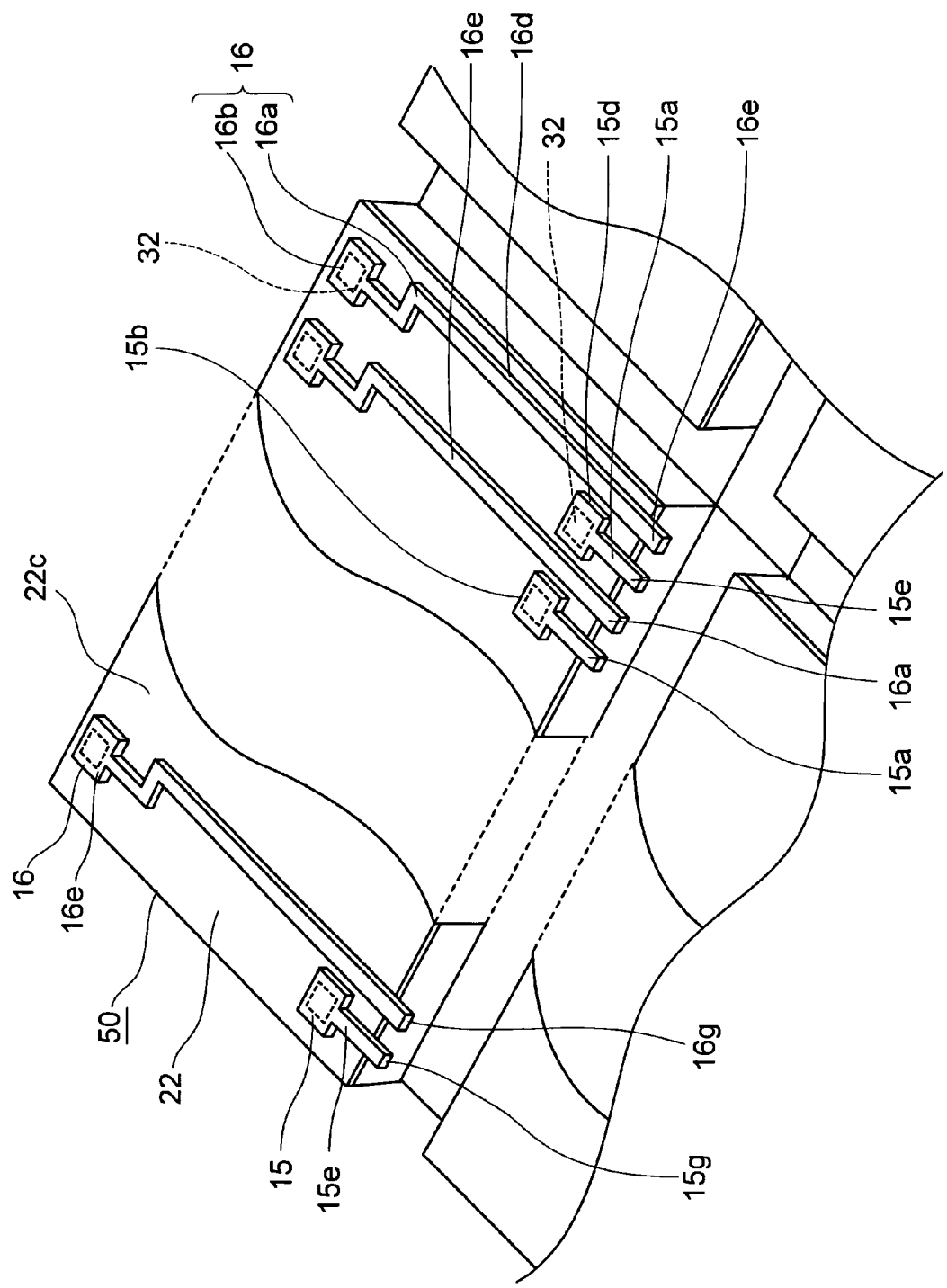
FIG. 25 is a perspective view illustrating an essential part of the semiconductor wafer used for manufacturing the device plate in FIG. 15.

The wiring electrode 15 is illustrated in detail in FIG. 15 and FIG. 25 in addition to FIG. 3. An end face 15g of the extended terminal portion 15a of the wiring electrode 15 is a projecting end face projecting outward from the surface 22c of the surface insulating layer 22. Further, the wiring electrode 15 has a cross side surface 15d, a top end face 15e, and an embedded portion 15f.

The cross side surface 15d is a side surface portion projecting outward from the surface 22c of the surface insulating layer 22 and crossing with the surface 22c to rise up from (almost intersecting to) the surface 22c. The top end face 15e is connected to the cross side surface 15d and projects outward from the surface 22c, and further has a rectangular portion disposed in a direction along the surface 22c and a band-shaped portion extending from the rectangular portion in a direction along the surface 22c toward the groove portion 20. The embedded portion 15f is a portion embedded inward from the surface 22c to connect to the connecting pad 32.

The electrode pad 15b is composed of the cross side surface 15d, the top end face 15e, and the embedded portion 15f, and the extended terminal portion 15a is composed of the cross side surface 15d and the top end face 15e.

The electrode pad 15b is connected to the connecting pad 32 via the contact hole 22b and the connecting hole 31a which are arranged to be stacked one on the other, and has a depth reaching the connecting pad 32. More specifically, the electrode pad 15b has a height (an expanded height) h15 expanded from the top end face 15e outer than the surface 22c to the connecting pad 32 via the contact hole 22b and the connecting hole 31a. The expanded height h15 is larger than a height h32 of the connecting pad 32 (h15>h32). For example, h15 is about 2 to 6 μm, and h32 is about 0.5 to 1 μm.

The wiring electrode 16 is also made of a conductive material such as Cu or the like. The wiring electrode 16 has an extended terminal portion 16a and a rectangular electrode pad 16b, and the extended terminal portion 16a and the electrode pad 16b have, as a whole, a protruding structure like the wiring electrode 15. An end face 16g of the extended terminal portion 16a of the wiring electrode 16 is a projecting end face projecting outward from the surface 22c.

Further, the wiring electrode 16 has a cross side surface 16d, a top end face 16e, and an embedded portion 16f. The cross side surface 16d is a side surface portion crossing with the surface 22c, like the cross side surface 15d. The top end face 16e has a rectangular portion disposed in a direction along the surface 22c and a band-shaped portion extending from the rectangular portion in a direction along the surface 22c toward the groove portion 20, like the top end face 15e. The embedded portion 16f is a portion embedded inward from the surface 22c and connected to the connecting pad 32, like the embedded portion 15f. Further, the electrode pad 16b is composed of the cross side surface 16d, the top end face 16e, and the embedded portion 16f, and the extended terminal portion 16a is composed of the cross side surface 16d and the top end face 16e. The electrode pad 16b also has an expanded height like the electrode pad 15b.

The extended terminal portions 15a and the electrode pads 15b of the wiring electrodes 15 are formed along a part of the outer periphery of the device region 10, whereas the extended terminal portions 16a of the wiring electrodes 16 are formed across the device region 10. Further, the electrode pads 16b are disposed along a part of the outer periphery of the device region 10 to be opposed to the electrode pads 15b.

Respective portions of the extended terminal portions 15a and the extended terminal portions 16a extend from the device region 10 into the groove portion 20. More specifically, the extended terminal portions 15a and the extended terminal portions 16a are formed such that their respective portions on their tip sides apart from the electrode pads 15b and 16b bulge out from an edge portion of the groove portion 20 and stay inside the groove portion 20 in the width direction. Further, the extended terminal portions 15a and the extended terminal portions 16a are formed such that their respective portions extending out from the device region 10 are in a protruding shape rising above the surface 22c of the in-groove insulating portions 22a.

The semiconductor wafer 1 has the extended terminal portions 15a and the extended terminal portions 16a. Therefore, in the cut surfaces when the semiconductor wafer 1 is cut along the groove portions 20, the later-described end faces 15c and 16c appear projecting outward from the surface 22c.

Further, a number of the wiring electrodes 15 and 16 are alternately arranged along the groove portion 20. These wiring electrodes 15 and 16 are united together to form a wiring electrode group 17. Further, in the wiring electrodes 15 and 16, the extended terminal portions 15a and 16a are extended only to the groove portion 20 on the left side or the right side that is a part of the four groove portions which are all of the groove portions surrounding and contacting with the device region 10, that is, the adjacent two groove portions 20 and 20 and two groove portions 21 and 21. The wiring electrode group 17 has an unevenly distributed structure by such an unevenly distributed arrangement of the extended terminal portions 15a and 16a.

Figure 4:
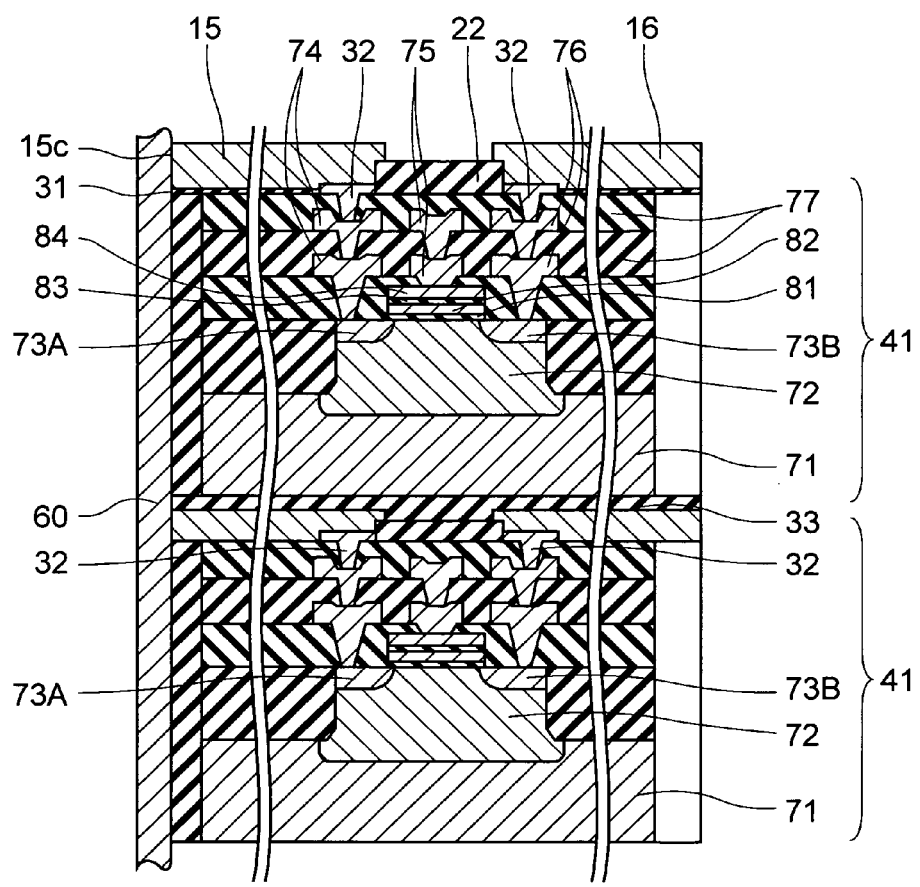
FIG. 4 is a sectional view mainly illustrating memory cells of a laminated chip package using two semiconductor wafers.

In the memory portion of the device region 10, a number of memory cells 41 as the semiconductor devices are formed. The memory cell 41 has a structure as illustrated in FIG. 4. FIG. 4 is a sectional view mainly illustrating memory cells 41 of a later-described laminated chip package 100 using two semiconductor wafers 1.

To the memory cell 41, the wiring electrodes 15 and 16 are connected via the connecting pads 32. The memory cell 41 is formed on the surface of an N-type substrate 71 constituting the semiconductor wafer 1. In FIG. 4, two memory cells 41 are laminated one on the other via an adhesive layer 33. The adhesive layer 33 is formed by an adhesive used when the semiconductor wafers 1 are bonded together.

Each of the memory cells 41 constitutes a flash memory and is formed on a P-type well 72 which is formed on the surface of the N-type substrate 71. The memory cell 41 has a source 73A and a drain 73B, insulating layers 77, an insulating film 81, a floating gate 82, an insulating film 83 and a control gate 84. The memory cell 41 further has a source electrode 74, a drain electrode 76 and a gate electrode 75.

Both of the source 73A and the drain 73B are N-type regions and connected with the source electrode 74 and the drain electrode 76, respectively. The insulating layers 77 are formed with contact holes for connecting the connecting pads 32 to the source electrode 74 and the drain electrode 76, respectively. The source electrode 74, the gate electrode 75, and the drain electrode 76 are connected to the source 73A, the control gate 84 and the drain 73B via the corresponding contact holes, respectively.

Method of Manufacturing Semiconductor Wafer

Figure 5:
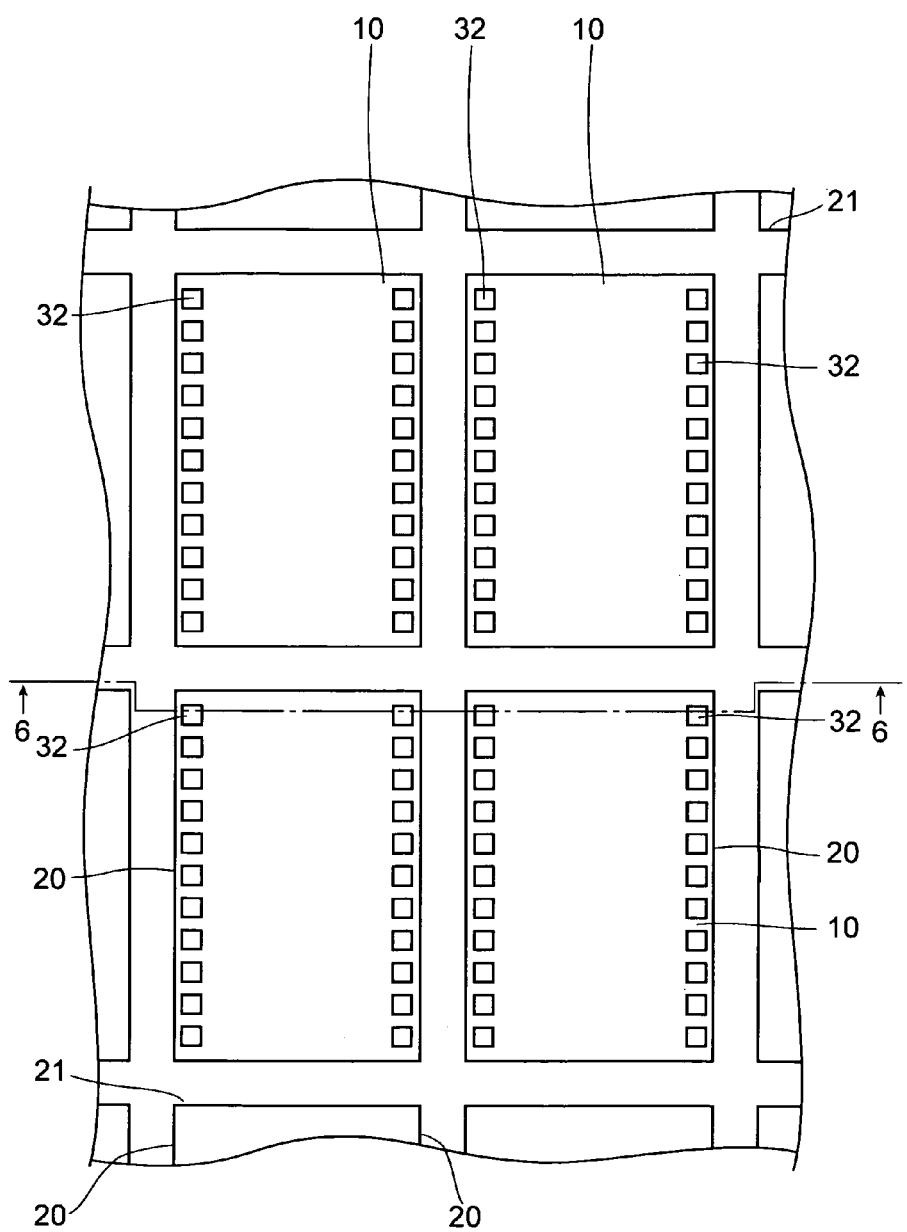
FIG. 5 is a plan view similar to FIG. 2, illustrating the partially manufactured semiconductor.
Figure 6:
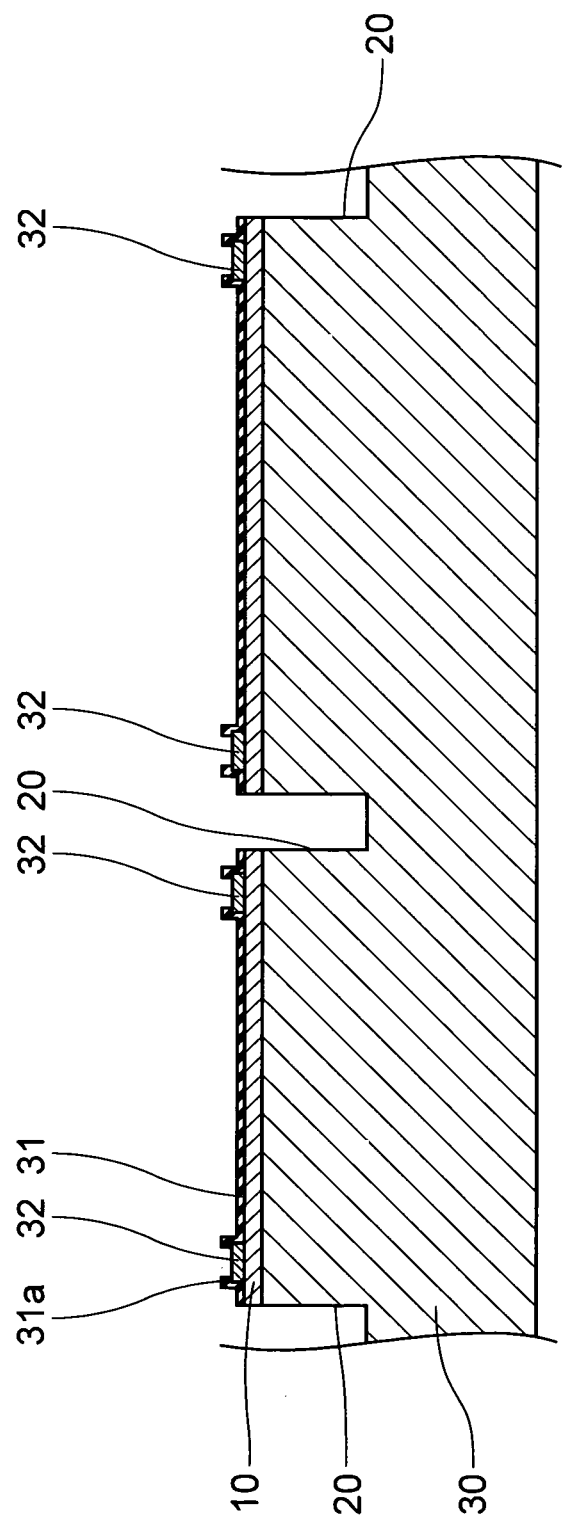
FIG. 6 is a sectional view taken along the line 6-6 in FIG. 5.
Figure 7:
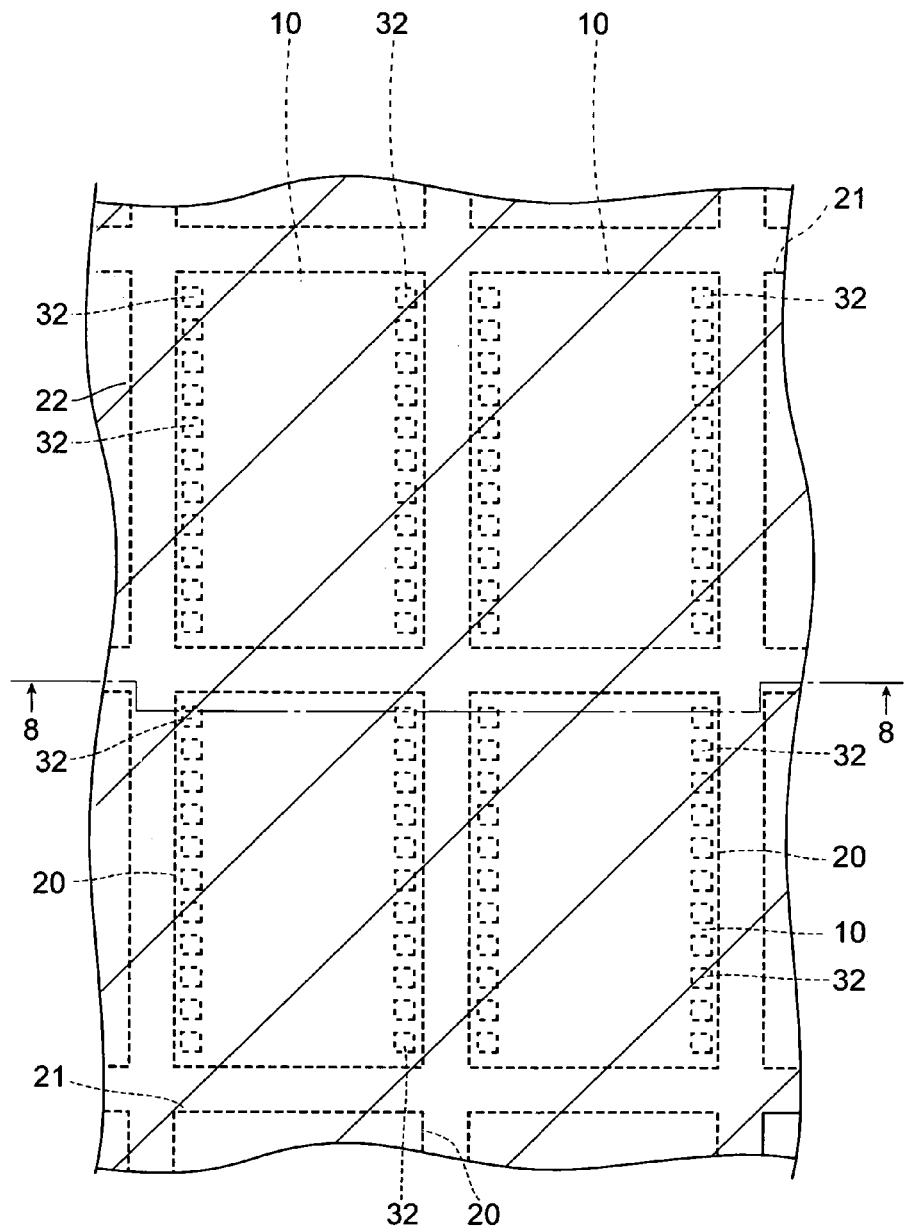
FIG. 7 is a plan view similar to FIG. 2, illustrating the semiconductor wafer subsequent to that in FIG. 5.
Figure 8:
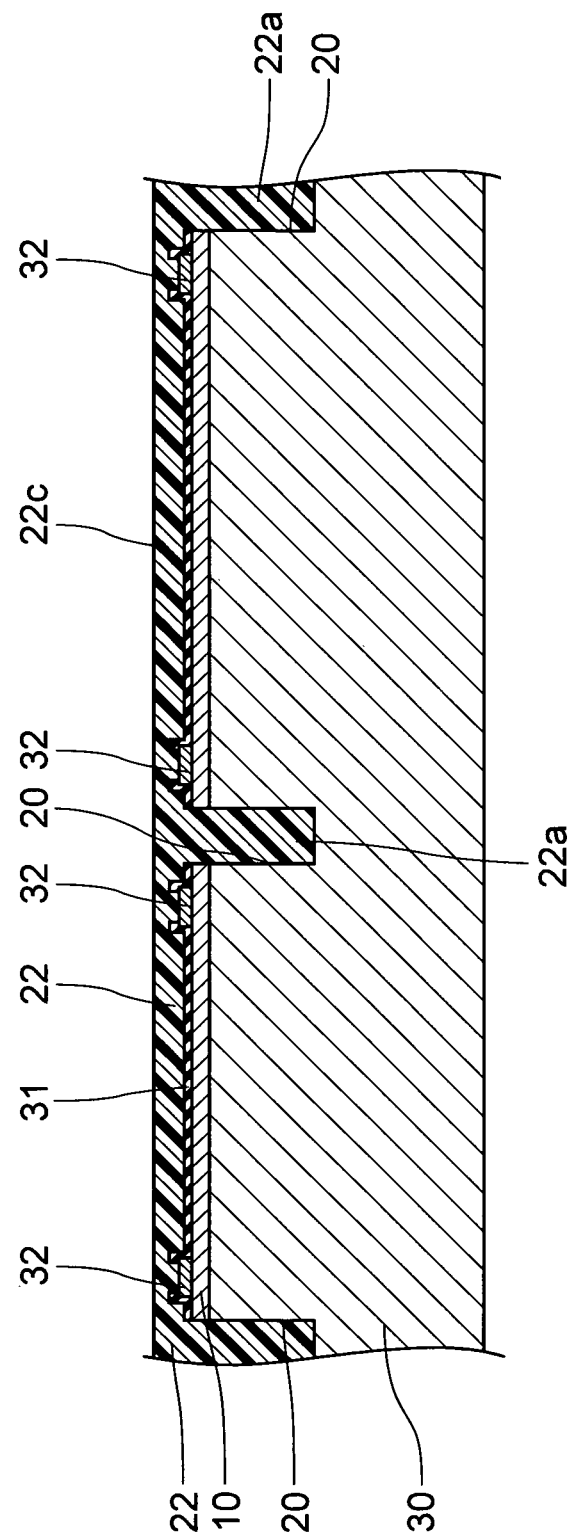
FIG. 8 is a sectional view taken along the line 8-8 in FIG. 7.
Figure 9:
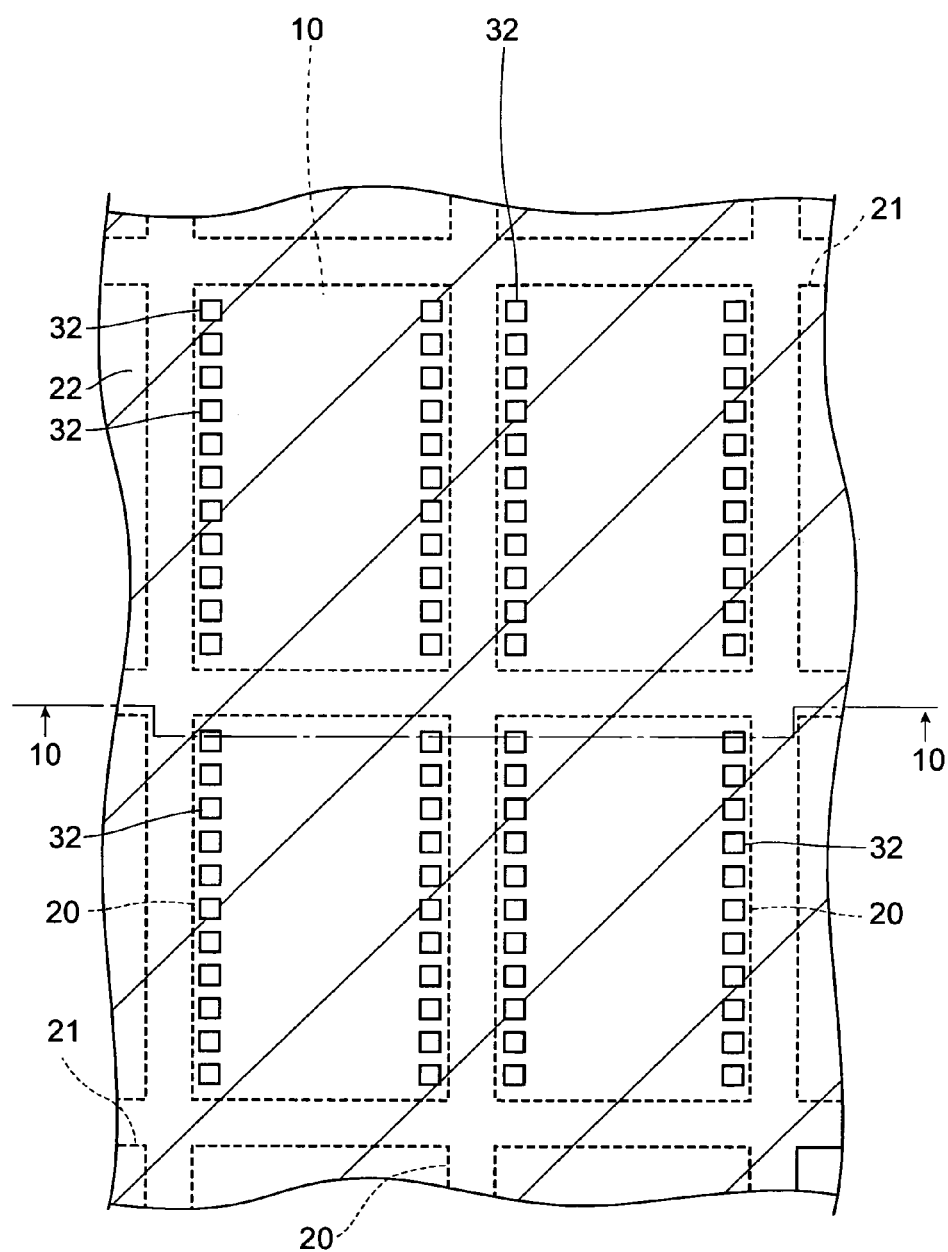
FIG. 9 is a plan view similar to FIG. 2, illustrating the semiconductor wafer subsequent to that in FIG. 7.
Figure 10:
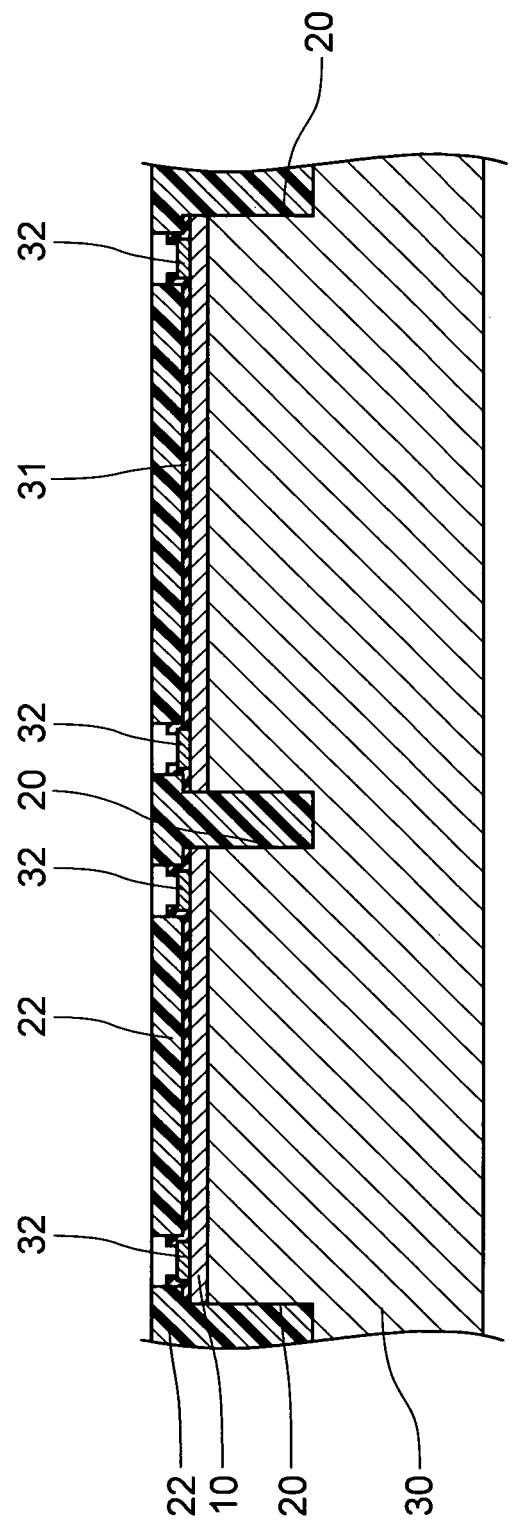
FIG. 10 is a sectional view taken along the line 10-10 in FIG. 9.

Subsequently, the method of manufacturing the semiconductor wafer 1 having the above-described structure will be described with reference to FIG. 5 to FIG. 10. Here, FIG. 5 is a plan view similar to FIG. 2, illustrating the partially manufactured semiconductor wafer, and FIG. 6 is a sectional view taken along the line 6-6 in FIG. 5. FIG. 7 is a plan view similar to FIG. 2, illustrating the semiconductor wafer subsequent to that in FIG. 5, and FIG. 8 is a sectional view taken along the line 8-8 in FIG. 7. FIG. 9 is a plan view similar to FIG. 2, illustrating the semiconductor wafer subsequent to that in FIG. 7, and FIG. 10 is a sectional view taken along the line 10-10 in FIG. 9. Note that hatching is given to the surface insulating layer 22 in FIG. 7 and FIG. 9 for convenience of illustration.

For manufacturing the semiconductor wafer 1, a wafer (unprocessed wafer) is prepared which has memory portions and a plurality of connecting pads 32 formed in the device regions 10 by performing wafer process. Then, the protecting insulating layer 31 is formed on the first surface 1a for the unprocessed wafer, and then the connecting holes 31a are formed at the locations in the protecting insulating layer 31 where the connecting pads 32 are to be formed, as illustrated in FIG. 6. Then, the groove portions 20 and 21 are formed along the scribe lines 3A and 3B. The groove portions 20 and 21 can be formed by the dicing saw, and may be formed by etching such as the reactive ion etching or the like.

Subsequently, a resin, for example, an epoxy resin, a polyimide resin or the like is applied to the entire first surface 1a. Then, the applied resin spreads over the entire surface of the unprocessed wafer and further flows into the groove portions 20 and 21. Subsequently, the surface of the unprocessed wafer is polished to be planarized. Thus, the surface insulating layer 22 is formed to cover the entire surface of the unprocessed wafer. The portions flowed into the groove portions 20 and 21 form the in-groove insulating portions 22a, so that the surface insulating layer 22 is formed integrally with the in-groove insulating portions 22a.

Subsequently, as illustrated in FIG. 9 and FIG. 10, the contact holes 22b are formed in the surface insulating layer 22 to expose the connecting pads 32. Thereafter, the wiring electrodes 15 and 16 are formed. The wiring electrodes 15 and 16 are formed in a shape having the above-described protruding structure and including the extended terminal portions 15a and 16a respectively. The wiring electrodes 15 and 16 can be formed, for example, in the procedure as follows.

First, a not-shown seed layer for plating is formed on the surface insulating layer 22. Next, a frame (not shown) including groove potions is formed on the seed layer. The frame is formed, for example, by patterning a photoresist by the photolithography. Further, a plating layer which will be portions of the wiring electrodes 15 and 16 is formed within the groove portions of the formed frame and on the seed layer. Subsequently, the frame is removed, and a portion of the seed layer other than the portion which exists under the plating layer is removed by etching. By the above processing, the wiring electrodes 15 and 16 can be formed of the plating layer and the seed layer thereunder.

Because, the wiring electrodes 15 and 16 are formed after the formation of the surface insulating layer 22, the extended terminal portions 15a and 16a are formed in a manner that they are wholly disposed on the surface 22c of the surface insulating layer 22. The electrode pads 15b and 16b are formed such that their peripheral portions are disposed on the surface 22c and their center portions are embedded inward from the surface 22c to connect with the connecting pads 32.

Method of Manufacturing Laminated Chip Package, and Structures of Laminated Chip Package and Device Plate By using a plurality of the same kind of semiconductor wafers 1 having the above-described structure, a laminated chip package 100 can be manufactured. The method of manufacturing the laminated chip package 100 will be described using FIG. 11 to FIG. 14 as follows.

Figure 11:
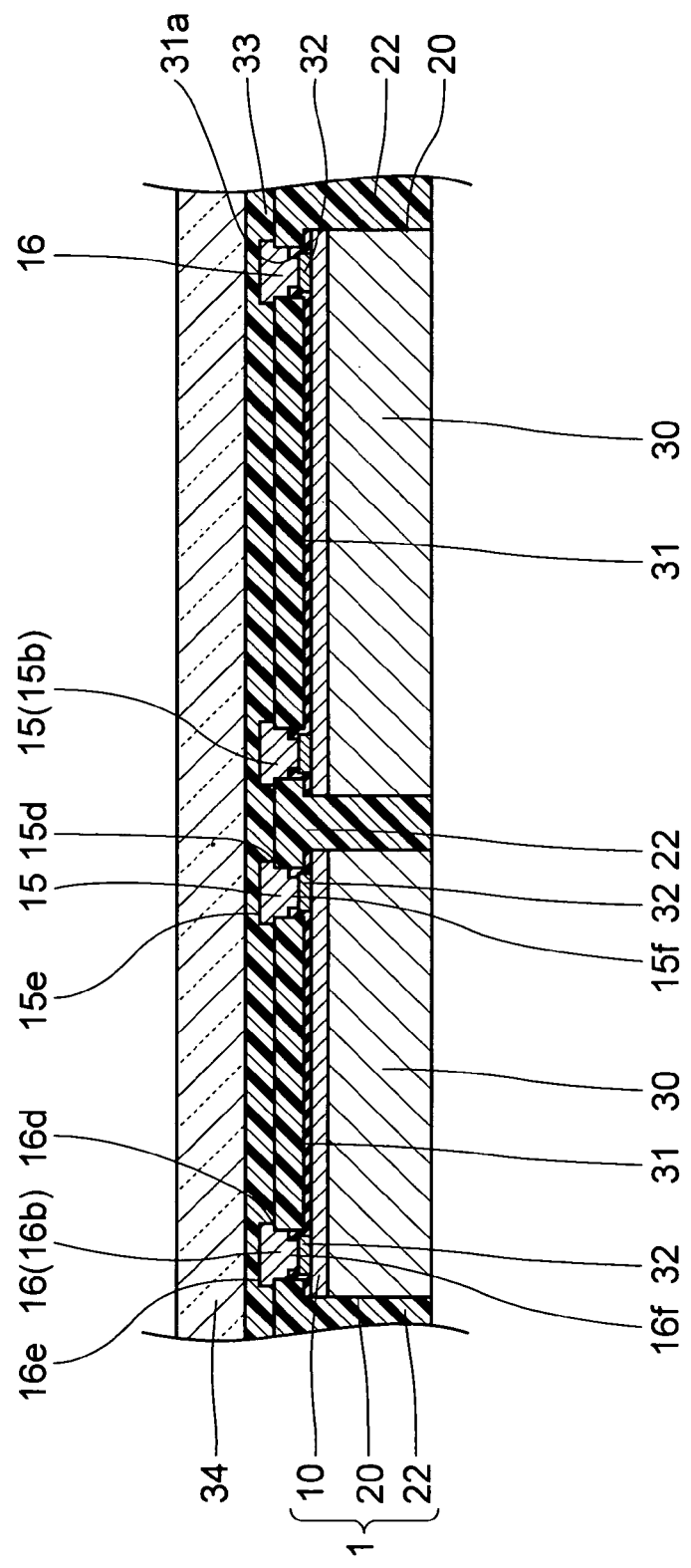
FIG. 11 is a sectional view similar to FIG. 3, illustrating the semiconductor wafer in the process of manufacturing a laminated chip package and a base.
Figure 12:
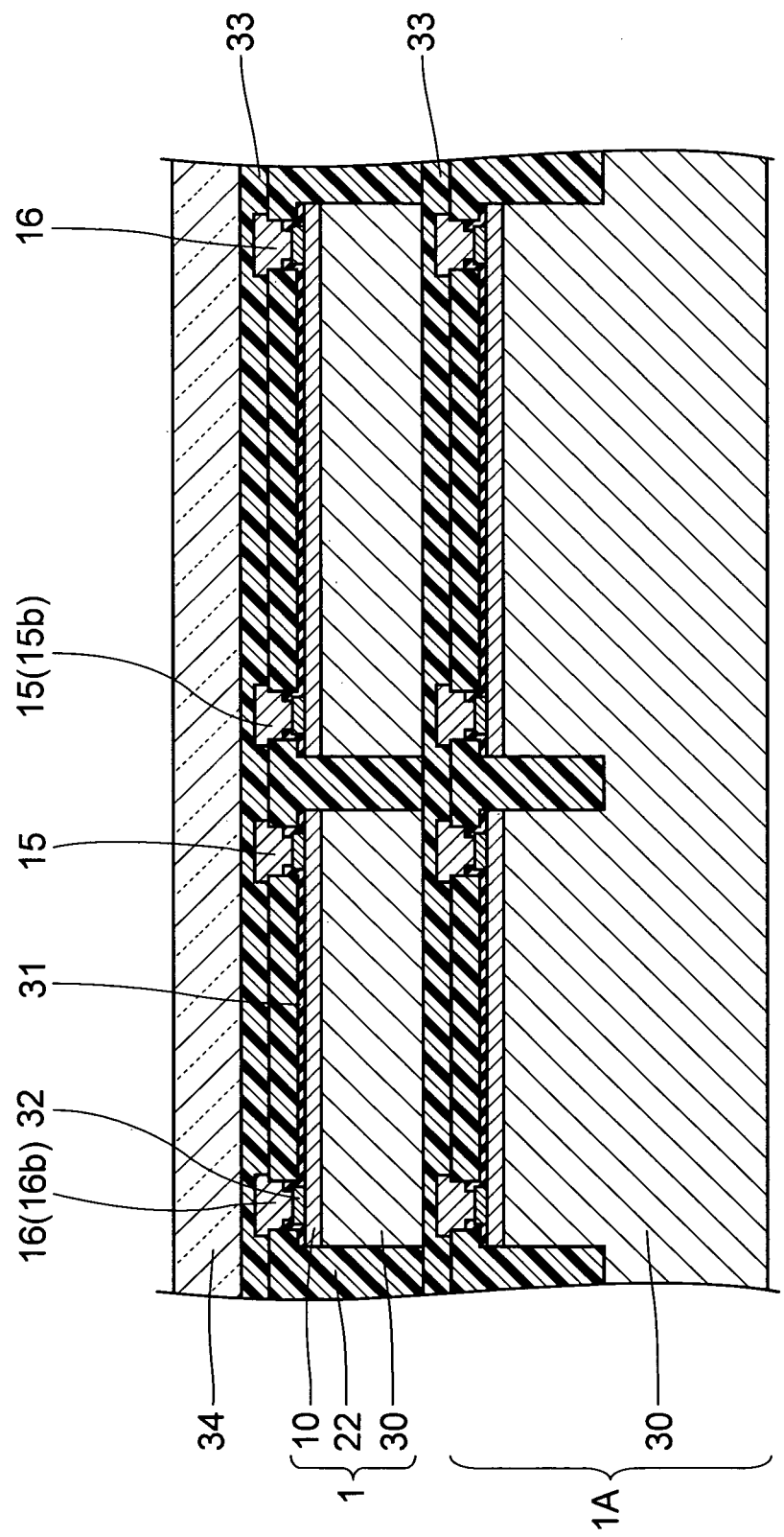
FIG. 12 is a sectional view similar to FIG. 3, illustrating the process subsequent to that in FIG. 11.

Here, FIG. 11 is a sectional view similar to FIG. 3, illustrating the semiconductor wafer 1 in the process of manufacturing the laminated chip package 100 and a base 34. FIG. 12 is a sectional view similar to FIG. 3, illustrating the process subsequent to that in FIG. 11, FIG. 13 is a sectional view similar to FIG. 3, illustrating the process subsequent to that in FIG. 12, and FIG. 14 is a sectional view similar to FIG. 3, illustrating the process subsequent to that in FIG. 13.

The laminated chop package 100 is manufactured as follows. First, an adhesive is applied on the first surface 1a of the above-described semiconductor wafer 1 to fix it to the base 34. In FIG. 11, the adhesive layer 33 made of the adhesive applied at this time is shown. The semiconductor wafer 1 is used as the uppermost substrate disposed at the uppermost position of a later-described laminated device wafer 98. The base 34 is a member for supporting the semiconductor wafer 1, and a glass plate is used for the base 34 in FIG. 11. Subsequently, the second surface 1b of the semiconductor wafer 1 is polished until the groove portions 20 and 21 appear so that the thickness of the semiconductor wafer 1 is decreased as illustrated in FIG. 11.

Next, another semiconductor wafer 1A having the same structure as that of the semiconductor wafer 1 is prepared and bonded to the second surface 1b side of the semiconductor wafer 1 as illustrated in FIG. 12 using an adhesive. In this event, position adjustment of the semiconductor wafer 1 and the semiconductor wafer 1A is performed such that the positions of the groove portions 20 and 21 of both of them coincide with each other. Then, the second surface 1b of the semiconductor wafer 1A is polished until the groove portions 20 and 21 appear. This polish decreases the thickness of the semiconductor wafer 1A to thereby obtain a laminated device wafer. In the laminated device wafer, a plurality of semiconductor wafers 1 are laminated.

Figure 13:
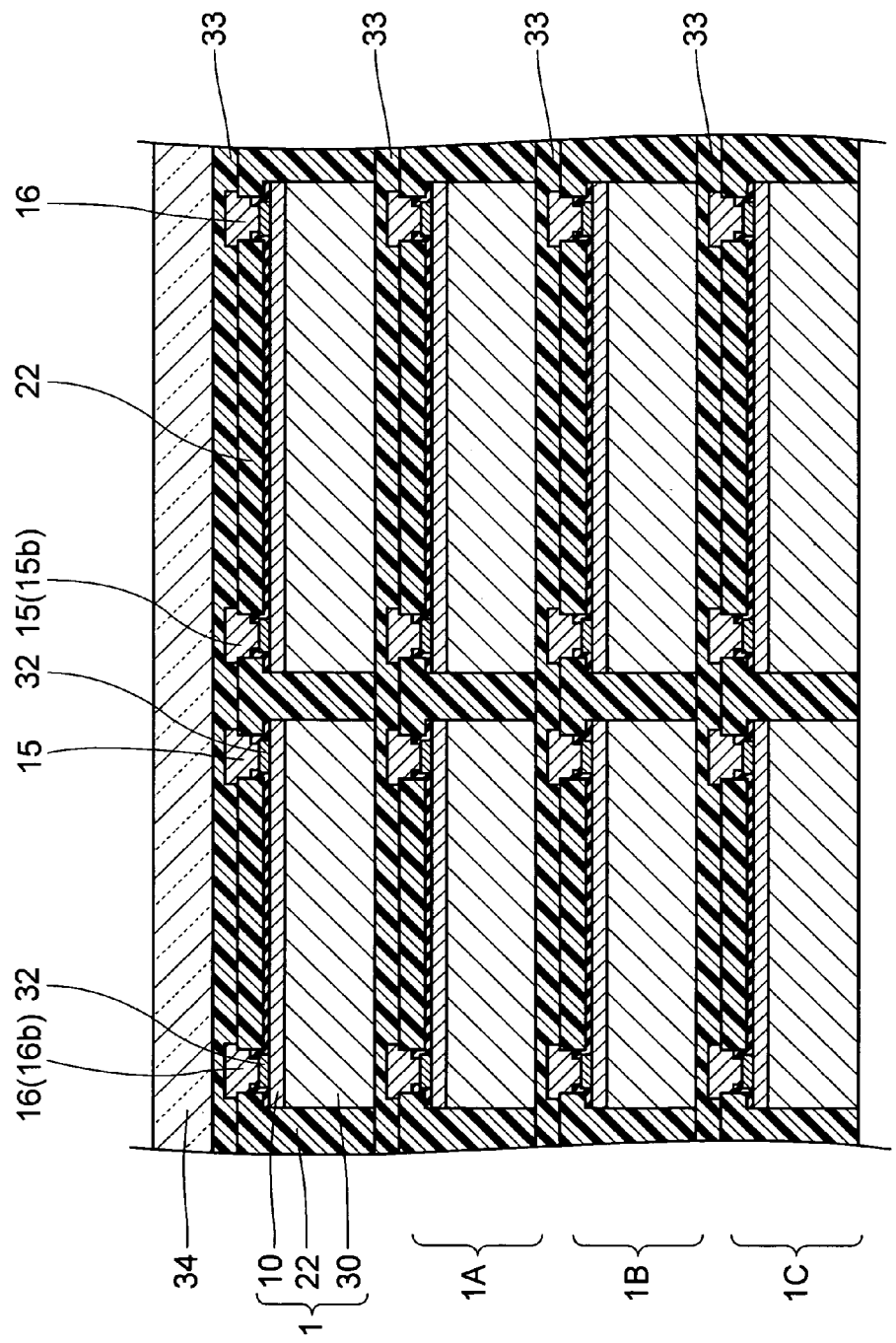
FIG. 13 is a sectional view similar to FIG. 3, illustrating the process subsequent to that in FIG. 12.
Figure 14:
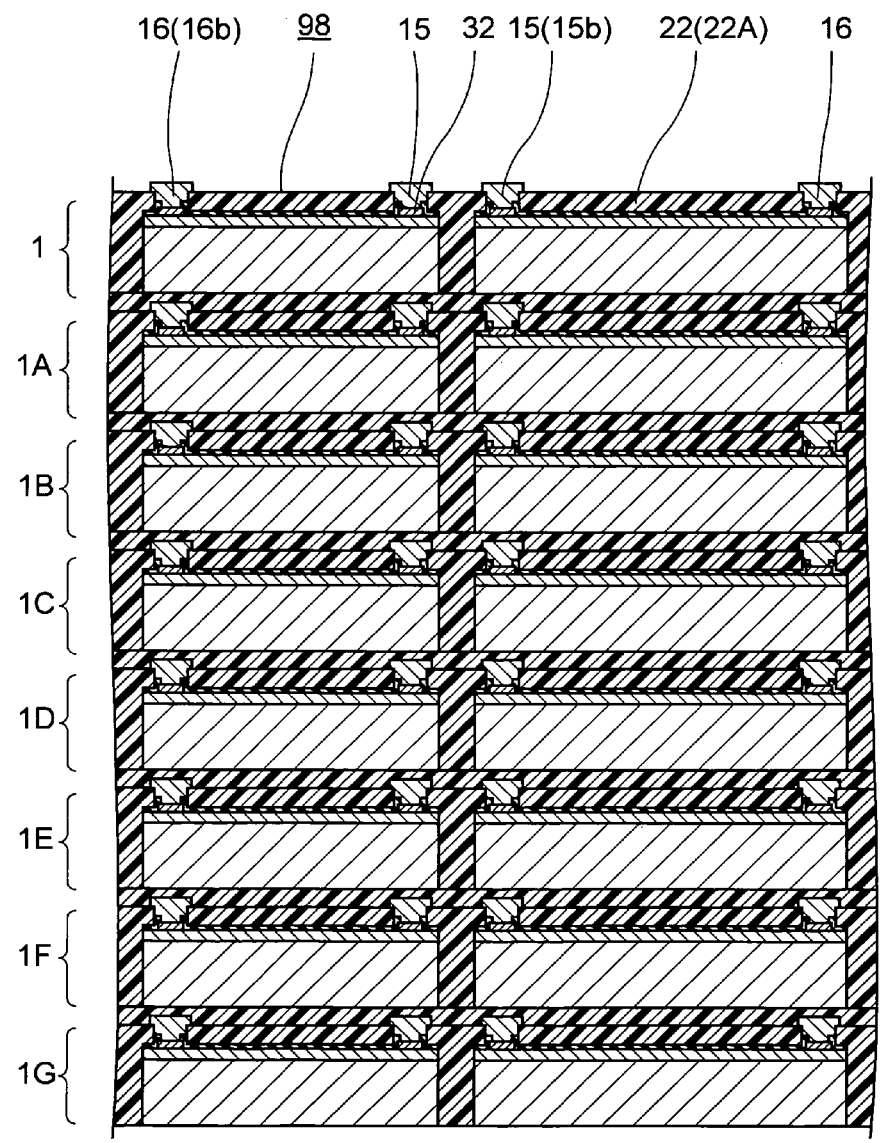
FIG. 14 is a sectional view similar to FIG. 3, illustrating the process subsequent to that in FIG. 13.

Further, as illustrated in FIG. 13, other semiconductor wafers 1B and 1C having the same structure as that of the semiconductor wafer 1 are prepared. Then, for each of the semiconductor wafers 1B and 1C, a process of bonding it to the second surface 1b side of the laminated device wafer and polishing it (a bonding and polishing process) is performed.

Continuously, the bonding and polishing process is repeatedly performed and then the base 34 and the adhesive layer 33 are removed, whereby the laminated device wafer 98 as illustrated in FIG. 14 is manufactured. In the laminated device wafer, 98, the semiconductor wafer 1 and the semiconductor wafers 1A, 1B, 1C, 1D, 1E, 1F, and 1G are stacked so that eight semiconductor wafers in total are laminated. In this laminated device wafer 98, the base 34 and the adhesive layer 33 have been removed therefrom, and therefore the wiring electrodes 15 and 16 of the semiconductor wafer 1 appear in a protruding shape.

Figure 16:
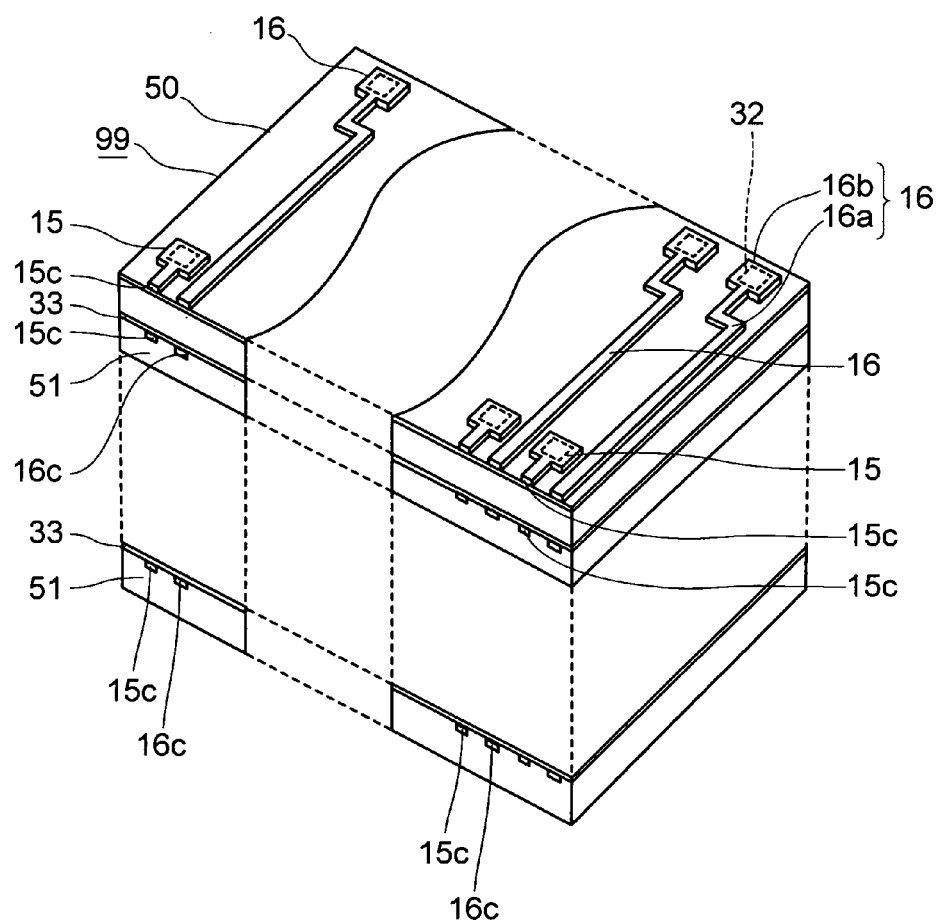
FIG. 16 is a perspective view illustrating an example of a device block.
Figure 17:
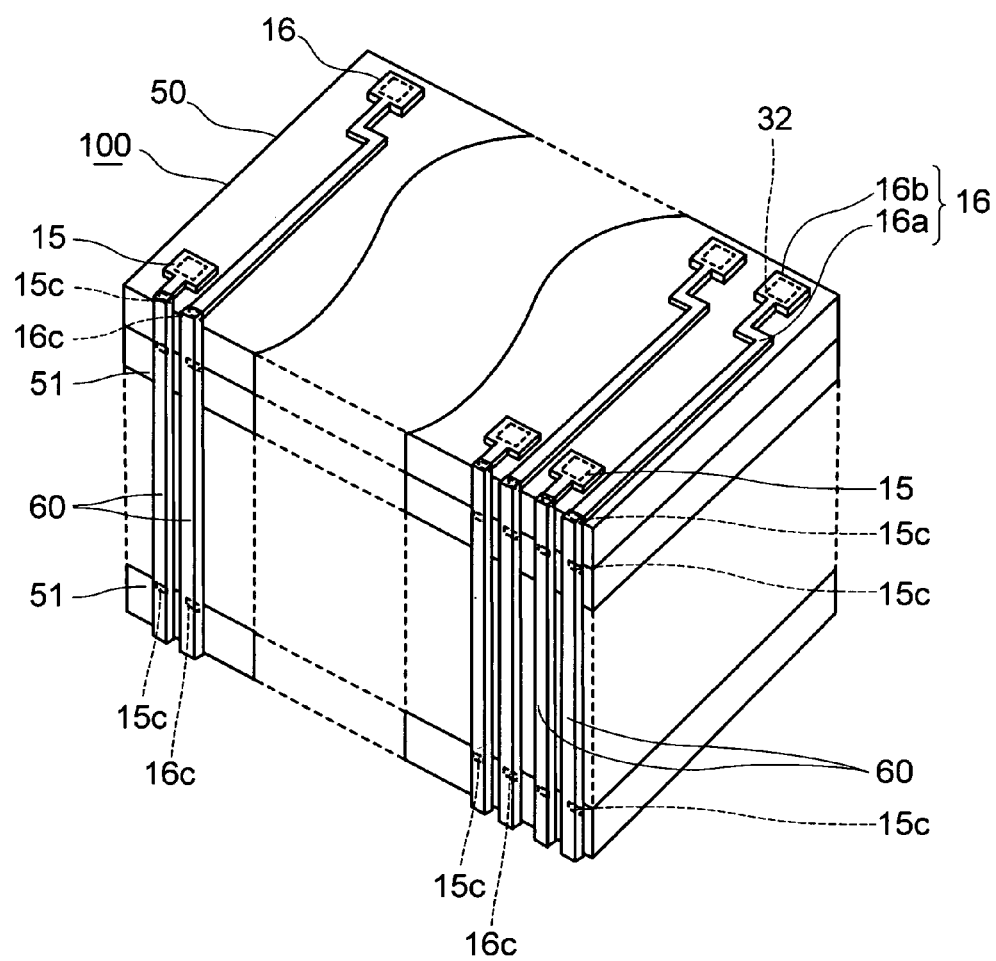
FIG. 17 is a perspective view illustrating an example of the laminated chip package with a part thereof omitted.

Subsequently, the laminated device wafer 98 is cut along the groove portions 20 and 21. Thus, a device block 99 in a rectangular parallelepiped shape is obtained as illustrated in FIG. 16. FIG. 16 is a perspective view illustrating the device block 99. One of four side surfaces of the device block 99 is a wiring side surface 99a. At the wiring side surface 99a, later-described end faces 15c and 16c of the extended terminal portions 15a and 16a appear to project outward from the surface 22c of the surface insulating layer 22. By forming connection electrodes 60 on the wiring side surface 99a as illustrated in FIG. 17, the laminated chip package 100 is manufactured. The connection electrodes 60 are formed in a band shape to connect the plural vertically arranged end faces 15c or the plural vertically arranged end faces 16c.

Figure 18:
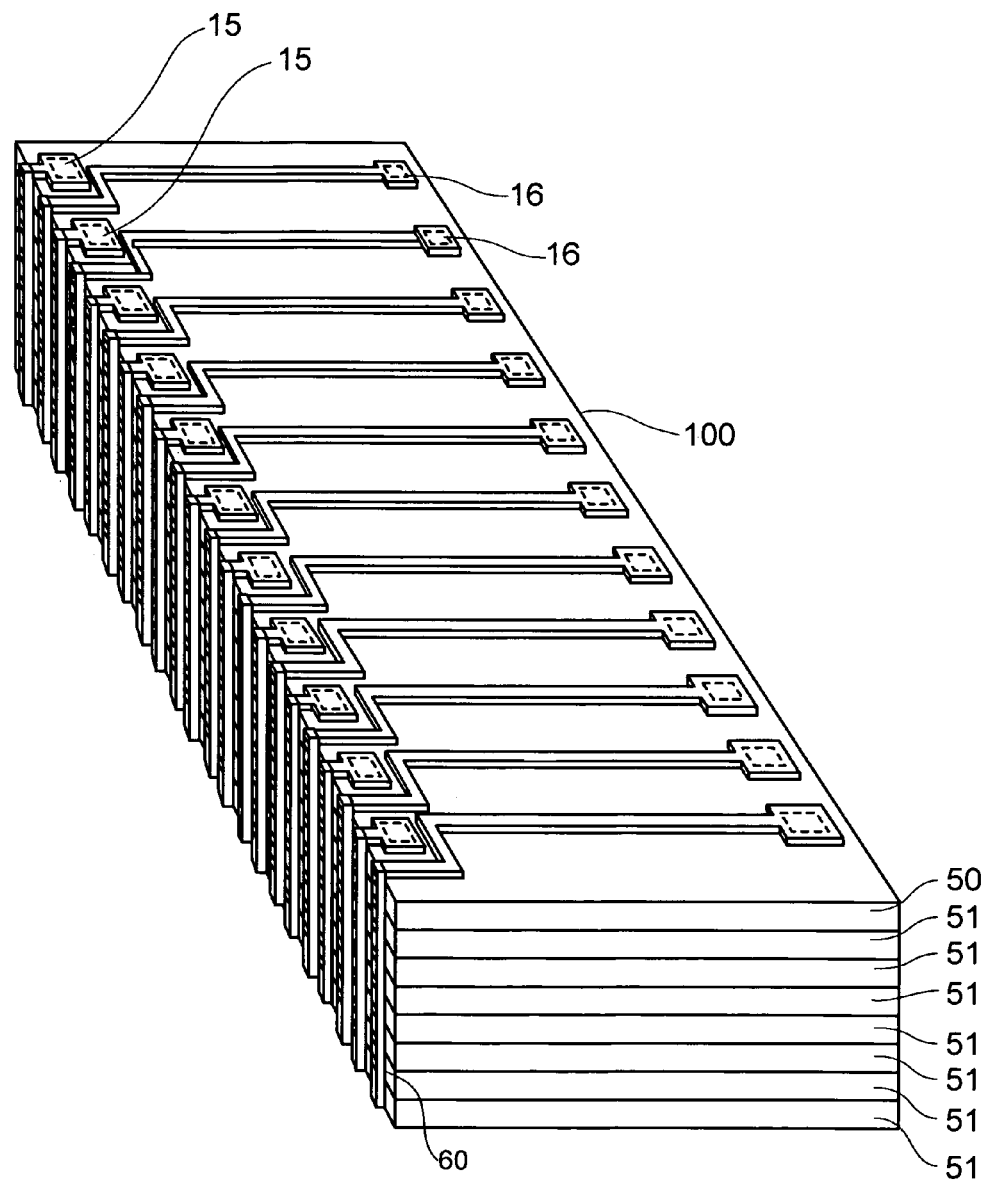
FIG. 18 is a perspective view illustrating an example of the same laminated chip package as in FIG. 17.

The laminated chip package 100 has a structure in which one device plate 50 and seven device plates 51 are stacked so that eight device plates in total are laminated as shown in FIG. 18 as well as FIG. 17.

Further, in the laminated chip package 100, wiring of the device plates 50 and 51 is realized by the connection electrodes 60. In the laminated chip package 100, all of the connection electrodes 60 are formed on the wiring side surface 99a that is one of four side surfaces. This realizes the single-side wiring structure in the laminated chip package 100. In the laminated chip package 100, a plurality of end faces 15c and a plurality of end faces 16c are formed, and the connection electrodes 60 are formed in a manner to respectively connect them in the vertical direction.

The laminated chip package 100 can realize memories with various storage capacities such as 64 GB (gigabyte), 128 GB, and 256 GB by varying the memory portions in the semiconductor wafer 1. Note that eight device plates are laminated in the laminated chip package 100. However, it is only necessary that a plurality of device plates are laminated, and the number of the laminated device plates is not limited to eight.

The laminated chip package 100 is manufactured by forming the connection electrodes 60 on the wiring side surface 99a. The end faces 15c and 16c connected by the connection electrodes 60 are formed in a manner to project upward from the surface 22c.

At the time of forming the connection electrodes 60, the mask pattern for forming the connection electrodes 60 needs to be accurately placed, but the laminated chip package 100 can be manufactured even if the position adjustment of the mask pattern is roughly performed. Even with the rough position adjustment, the connection electrodes 60 connecting the vertically arranged plural end faces 15c or the vertically arranged plural end faces 16c can be formed.

More specifically, in the laminated chip package 100, the alignment does not need to be performed with high accuracy when forming the connection electrodes 60. Therefore, the process after the device block 99 in the rectangular parallelepiped shape is obtained can be simplified, thereby simplifying the whole manufacturing process of the laminated chip package 100. Accordingly, the manufacturing time of the laminated chip package 100 can be reduced. This can increase the number of laminated chip packages 100 manufacturable in a unit time, resulting in a reduced manufacturing cost of the laminated chip package 100.

The reason why the alignment does not need to be performed with high accuracy when forming the connection electrodes 60 is given as follows.

First of all, the device block 99 has four side surfaces composed of cut surfaces when the laminated device wafer 98 is cut. In one of cut surfaces, the end faces 15c and 16c appear as end faces projecting similarly to the end faces 15g and 16g (see FIG. 25 for details). This is because of the following reason. Note that the end face projecting is also referred to as a projecting end face in this embodiment.

The wiring electrodes 15 and 16 of each of the semiconductor wafers 1 (also the semiconductor wafer 1A, 1B, 1C, 1D, 1E, 1F, 1G) have the extended terminal portions 15a and the extended terminal portions 16a respectively. The extended terminal portions 15a and the extended terminal portions 16a are extended inside the groove portions 20. For this reason, when the laminated device wafer 98 is cut along the groove portions 20 and 21, the extended terminal portions 15a and the extended terminal portions 16a are also cut. Further, the end faces 15c and 16c formed when the extended terminal portions 15a and the extended terminal portions 16a are cut appear at one of the cut surfaces.

On the other hand, the extended terminal portions 15a and 16a are formed in the protruding shape similarly to the electrode pads 15b and 16b having the expanded height h15. Therefore, the end faces 15c and 16c appear as projecting end faces projecting upward from the surface 22c.

For the connecting pads 32, a case where terminal portions extending to the inside of the groove portion 20 are formed is discussed here (the terminal portions are referred to as virtual terminal portions). In this case, end faces of the virtual terminal portions will appear at the side surface of the device block.

However, the extended terminal portions 15a and 16a have top end faces 15e and 16e common with the electrode pads 15b and 16b having the expanded height h15 and are formed to be larger in thickness than the connecting pads 32. For this reason, the end faces 15c and 16c will appear having a larger size than the end faces of the above-described virtual terminal portions. In the device block 99, the end faces 15c and 16c having such a large size appear arranged in the vertical direction, so that the end faces 15c are easily connected to each other and the end faces 16c are also easily connected to each other. It is only necessary for the connection electrodes 60 to connect the end faces 15c or the end faces 16c. Therefore, the position adjustment of the mask pattern may be roughly performed at the time when the connection electrodes 60 are formed. For this reason, the alignment does not need to be performed with high accuracy when forming the connection electrodes 60 in the device block 99.

Besides, the large size of the end faces 15c and 16c means that the sectional areas of the wiring electrodes 15 and 16 have been expanded. Accordingly, the resistance values of the wiring electrodes 15 and 16 can be decreased. This causes the current flowing through the wiring electrodes 15 and 16 to easily flow, so that the power consumption of the laminated chip package 100 can also be reduced.

Thus, the semiconductor wafer 1 has the wiring electrodes 15 and 16 as described above, whereby the manufacturing process of the laminated chip package 100 can be simplified to reduce the manufacturing time.

Further, the device block 99 has the electrode pads 15b and 16b rising above in the protruding shape appearing at its upper surface. When pad-like terminals rising above the surface of the insulating layer are required, the laminated chip package needs to be manufactured by stacking the terminal layer including such pad-like terminals (such a terminal layer is an interposer having no semiconductor device).

However, in the device block 99, the device plate 50 having the electrode pads 15b and 16b rising above in the protruding shape is laminated at the uppermost position. Therefore, it is unnecessary to stack the interposer. Therefore, the terminal layer is not necessary, so that the laminated chip package 100 has a compact structure with an accordingly smaller height.

Further, because the semiconductor wafer 1 has the extended terminal portions 15a and 16a extending inside the groove portions 20, the end faces 15c and 16c can appear at the cut surfaces when the laminated device wafer is cut along the groove portions 20. In other words, by cutting the laminated device wafer 98, in which the semiconductor wafers 1 are laminated, along the groove portions 20, the end faces 15c and 16c can be obtained.

Therefore, it is unnecessary, when using the semiconductor wafer 1, to separately provide another process in order to make the wirings connecting to the device regions 10 appear at the cut surfaces. If the wiring electrodes 15 and 16 do not have the extended terminal portions 15a and 16a, the wiring electrodes 15 and 16 cannot be cut even by cutting the laminated device wafer along the groove portions 20. Therefore, only by cutting the laminate device wafer along the groove portions, the wirings connecting to the device regions 10 cannot be made to appear at the cut surfaces. Thus, in order to make such wirings appear at the cut surfaces, another process needs to be performed.

In contrast, in the case of using the semiconductor wafer 1, the end faces of the wiring electrodes 15 and 16 can be made to appear at the cut surfaces when the laminated device wafer is cut along the groove portions, and therefore it is unnecessary to separately perform a process for making the wirings appear. Consequently, the manufacturing process of the laminated chip package can be further simplified by using the semiconductor wafer 1.

Further, the wiring electrodes 15 and 16 are formed to rise above the surface insulating layer 22. Therefore, when the end faces 15c and 16c appear at the cut surface, the end faces 15c located one above the other are arranged via the surface insulating layer 22 and the end faces 16c located one above the other are arranged via the surface insulating layer 22. Accordingly, a situation that the device plates located one on the other short-circuit can be prevented.

Further, the wiring electrodes 15 and 16 in the semiconductor wafer 1 form the wiring electrode group 17, and the wiring electrode group 17 has an unevenly distributed structure in which the wiring electrodes 15 and 16 are unevenly distributed at a part of the groove portions 20 and 21 which are in contact with the device region 10. This ensures that when the laminated chip package 100 is manufactured using the semiconductor wafer 1, the wiring connecting to the device region 10 can be placed closely to a single side surface to realize the single side surface wiring of the laminated chip package 100.

Consequently, the semiconductor wafer 1 is suitable for manufacturing the laminated chip package 100 which can realize the single side surface wiring. Further, an inspection to examine presence or absence of a defective chip needs to be performed only on part of the cut surfaces of the semiconductor wafer 1. Accordingly, the process of manufacturing the laminated chip package could be further simplified by using the semiconductor wafer 1.

In addition, because the extended terminal portions 15a and 16a have a narrow-width structure having narrower widths than those of the electrode pads 15b and 16b, many wiring electrodes 15 and 16 can be arranged in the device region 10. Accordingly, the wiring density of the wiring electrodes 15 and 16 can be increased in the semiconductor wafer 1. Furthermore, the memory portions of each device region 10 are formed on the same plane in the semiconductor wafer 1, so that the alignment error is 0 (zero).

Meanwhile, the device block 99 has a structure that the device plate 51 illustrated in FIG. 16 is laminated under the device plate 50 illustrated in FIG. 15.

In the device block 99, the end faces 15c and 16c appear at the wiring side surface 99a being one of the side surfaces of the device block 99. The wiring side surface 99a is a cut surface when the laminated device wafer 98 is cut along the groove portions 20 and 21.

The device plate 50 is a first semiconductor plate according to the embodiment of the present invention and is formed as a whole in a thin rectangular plate shape as illustrated in FIG. 15, and its four side surfaces are covered by the insulating layer. This insulating layer is formed by cutting the semiconductor wafer 1 along the groove portions 20 and 21, and therefore is made of the same resin as that of the in-groove insulating portions 22a.

Further, in the device plate 50, the flat surface on one side is the surface 22c of the surface insulating layer 22, and the plural three-dimensional wiring electrodes 15 and three-dimensional wring electrodes 16 rising above the surface 22c are formed. The end faces 15c and 16c of the wiring electrodes 15 and the wiring electrodes 16 appear as projecting end faces at a side surface 50A being one of the four side surfaces. The end faces 15c and 16c are first projecting end faces and can be connected to the connection electrodes 60. The surface insulating layer 22 of the device plate 50 constitutes its own surface layer, and constitutes the surface layer of the laminated chip package 100.

The device plate 51 is a second semiconductor plate according to this embodiment of the present invention. The device plate 51 is different from the device plate 50 in that the device plate 51 has the adhesive layer 33 covering the surface 22c and the wiring electrodes 15 and the wiring electrodes 16. The device plate 51 has the same structure as that of the device plate 50 in other points. In the device plate 51, the end faces 15c and 16c of the wiring electrodes 15 and the wiring electrodes 16 are formed as projecting end faces projecting outward from the surface 22c of the surface insulating layer 22 below the end faces 15c and 16c of the device plate 50. Further, the device plate 51 is laminated under the device plate 50 via the adhesive layer 33.

Second Embodiment

Structure of Semiconductor Wafer

Figure 19:
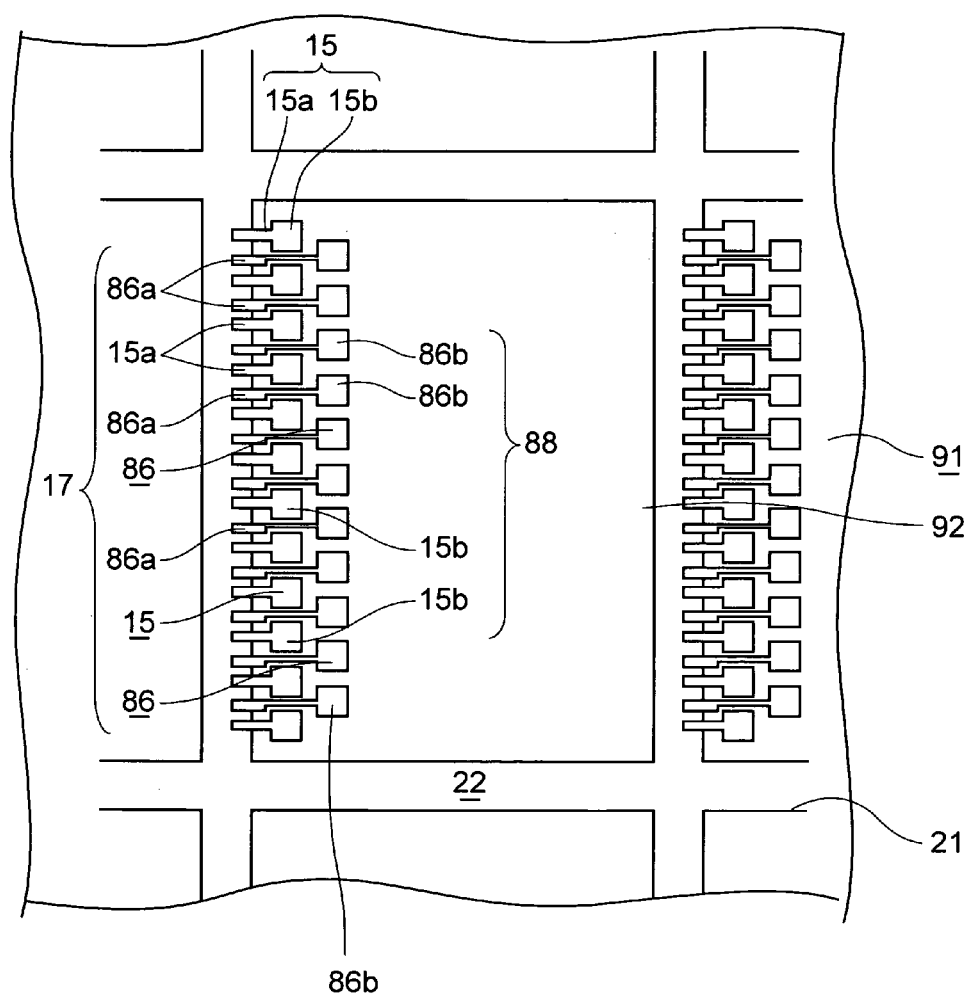
FIG. 19 is a plan view illustrating a device region and a region surrounding it formed in a semiconductor wafer according to a second embodiment of the present invention.

To begin with, the structure of a semiconductor wafer 91 according to the second embodiment of the present invention will be described with reference to FIG. 19.

The semiconductor wafer 91 according to this embodiment is different in that it has a device region 92 in place of the device region 10 and that it has wiring electrodes 86 in place of the wiring electrodes 16 as compared with the semiconductor wafer 1.

The device region 92 is different from the device region 10 in that the wiring electrodes 86 are formed as well as the wiring electrodes 15.

The wiring electrode 86 is made of a conductive material such as Cu or the like, and has an extended terminal portion 86a and a rectangular electrode pad 86b. The extended terminal portion 86a and the electrode pad 86b of the wiring electrode 86 are formed along a part of the outer periphery of the device region 92, similarly to the wiring electrode 15. Thus, in the device region 92, the wiring electrodes 15 and 86 form the same wiring electrode group 17 as in the device region 10, and additionally, all of their electrode pads 15b and 86b are gathered to a single side of the device region 92. In such a manner, the wiring electrodes 15 and 86 form a gathered pad group 88 in the device region 92.

In the semiconductor wafer 1 according to the first embodiment, the extended terminal portion 16a of the wiring electrode 16 is formed across the device region 10. Therefore, a certain length of the extended terminal portion 16a needs to be secured in the semiconductor wafer 1.

On the other hand, in the semiconductor wafer 91, the extended terminal portions 86a are formed along a part of the outer periphery of the device region 92, so that the length of the extended terminal portion 86a can be made smaller than that of the extended terminal portion 16a. In the semiconductor wafer 91, the length of the extended terminal portion 86a is reduced to allow more quick access to the device region 92. Further, the amount of plating or the like required for forming the wiring electrodes 86 can be reduced as compared to the case of forming the wiring electrodes 16, resulting in a reduced cost.

In addition, the semiconductor wafer 91 can be used to simplify the manufacturing process of the laminated chip package which can realize the single side surface wiring, as with the semiconductor wafer 1.

Figure 23:
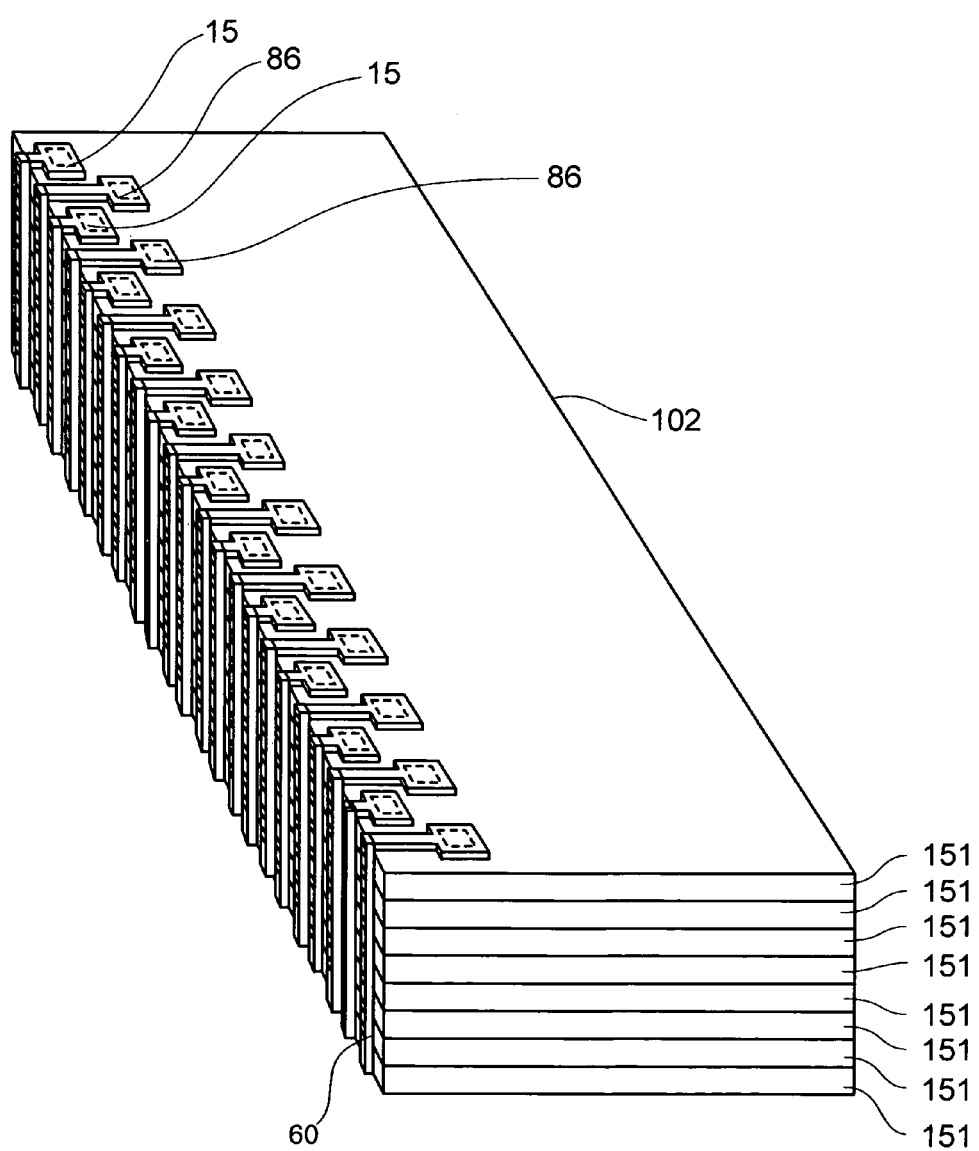
FIG. 23 is a perspective view illustrating another laminated chip package.

Further, it is possible to manufacture device plates 151 which are similar to the device plate 50 using the semiconductor wafer 91, and laminate the eight device plates 151 one on the other to thereby manufacture a laminated chip package 102 as illustrated in FIG. 23.

Method of Manufacturing Semiconductor Wafer

The manufacture of the semiconductor wafer 91 is performed similarly to the manufacture of the semiconductor wafer 1 before the formation of the wiring electrodes 15 and 86. Thereafter, the wiring electrodes 15 and 86 are formed in shapes including the above-described extended terminal portions 15a and 86a. The wiring electrodes 15 and 86 can be formed by the procedure similar to that of the semiconductor wafer 1.

Other Embodiments

Figure 20:
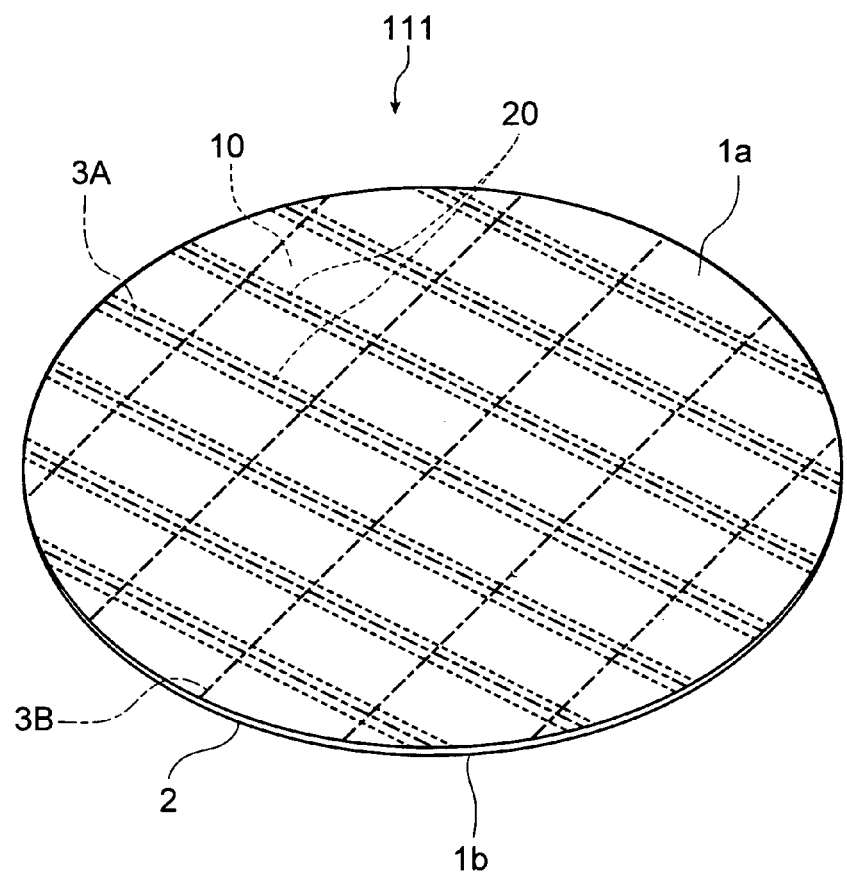
FIG. 20 is a perspective view illustrating the entire semiconductor wafer according to another embodiment of the present invention.
Figure 21:
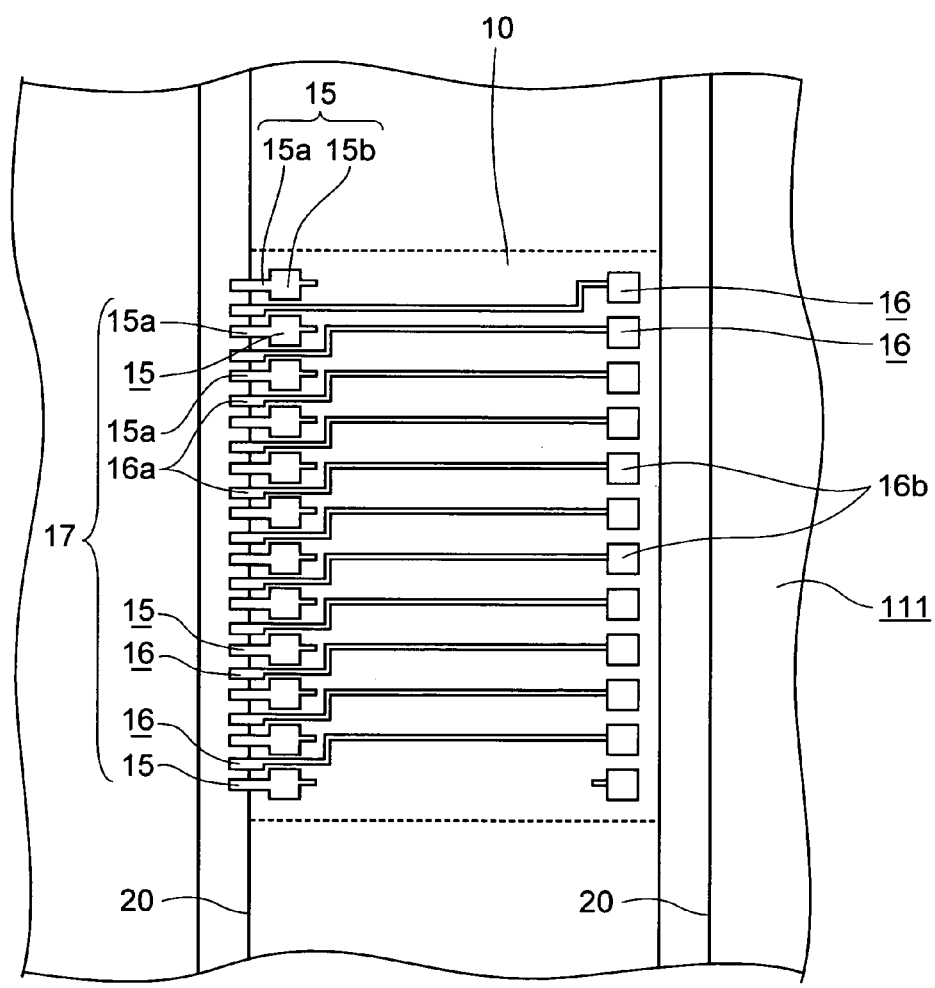
FIG. 21 is a plan view illustrating a device region and a region surrounding it formed in the semiconductor wafer in FIG. 20.

A semiconductor wafer 111 will be described with reference to FIG. 20 and FIG. 21. In the semiconductor wafer 1 according to the first embodiment, the groove portions 20 and 21 are formed. The semiconductor wafer 111 is different from the semiconductor wafer 1 in that groove portions 21 are not formed but only groove portions 20 are formed. Accordingly, the semiconductor wafer 111 is formed such that a plurality of groove portions 20 are arranged at regular intervals and the groove portions are formed in the shape of stripes not intersecting with each other.

Figure 22:
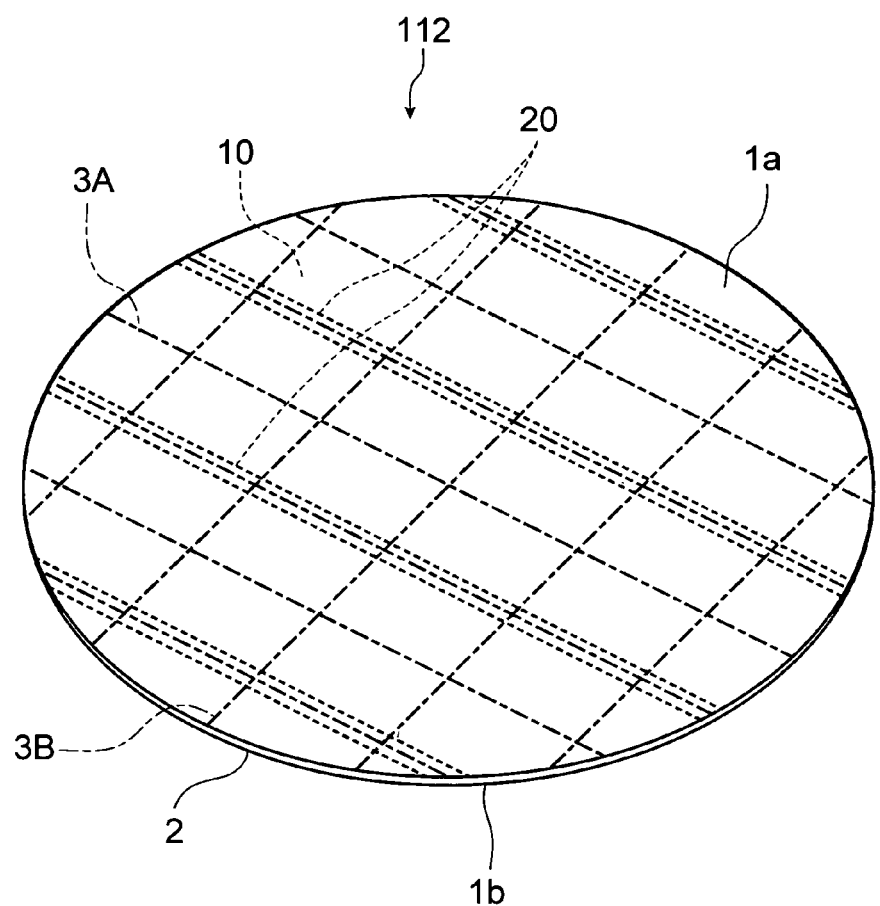
FIG. 22 is a perspective view illustrating the entire semiconductor wafer according to still another embodiment of the present invention.

A semiconductor wafer 112 illustrated in FIG. 22 is the same as the semiconductor wafer 111 in that only groove portions 20 are formed, but the groove portion 20 is formed along every other scribe line 3A.

In the semiconductor wafer 1, the device region 10 is in contact with the four groove portions 20 and 21, so that the device region 10 is in contact with the groove portions 20 and 21 in the four directions, that is, upper, lower, right and left directions. Accordingly, as illustrated in FIG. 15, the device plate 50 manufactured from the semiconductor wafer 1 is covered by the same resin as that of the in-groove insulating portions 22a at the four side surfaces.

Figure 24:
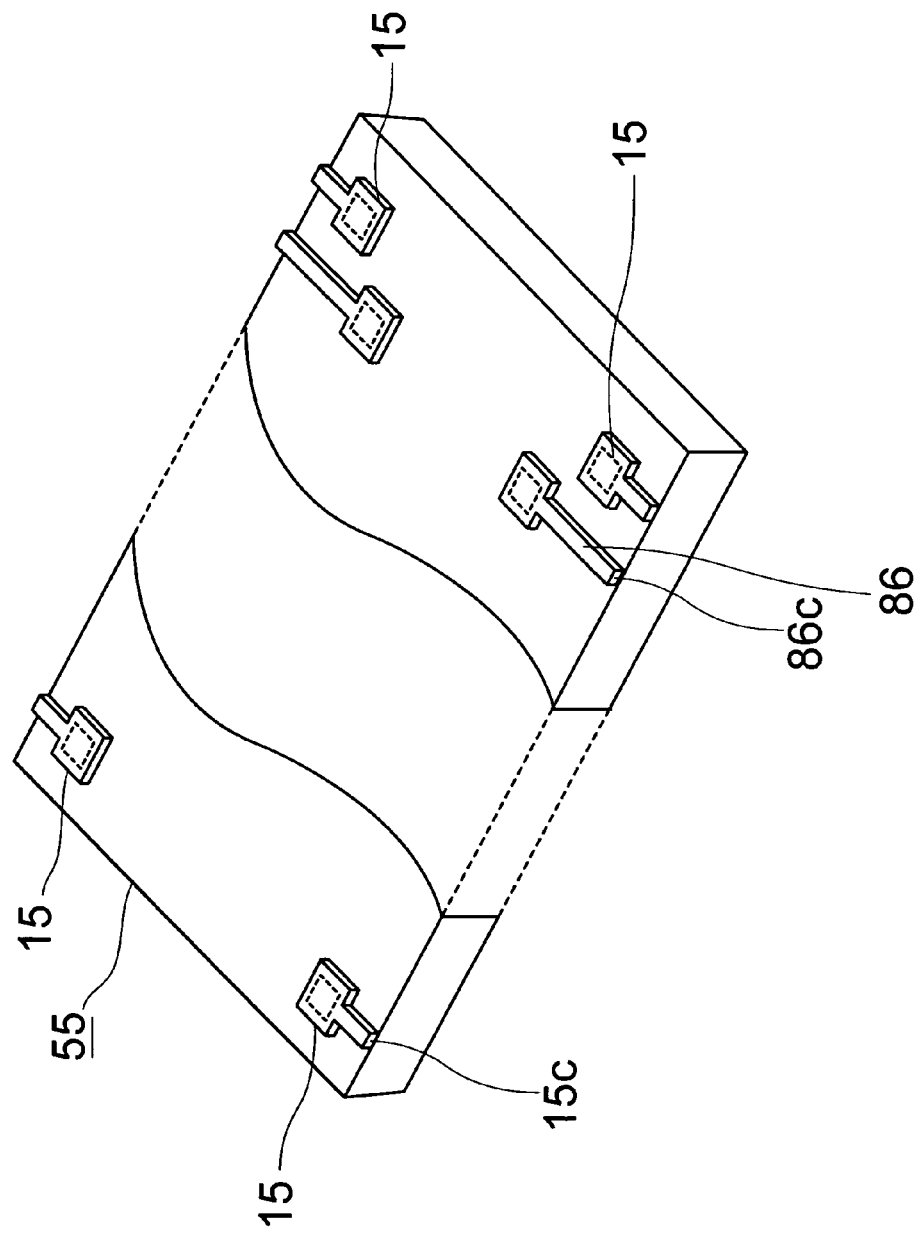
FIG. 24 is a perspective view illustrating another device plate.

In contrast, in the semiconductor wafer 111, the device region 10 is in contact with the groove portions 20 only in the two, that is, right and left directions. Accordingly, a device plate 55 using the semiconductor wafer in which the groove portions are formed in the shape of stripes as in the semiconductor wafer 111 is as illustrated in FIG. 24. The device plate 55 has two sets of opposite side surfaces, that is, a side surface 55A and a side opposite thereto and a side surface 55B and a side opposite thereto, which are structured such that only the side surface 55A and the side opposite thereto are covered by resin but the side surface 55B and the side opposite thereto are not covered by any resin.

Further, the device plate 55 is formed such that the wiring end faces 15c and 86c of the wiring electrodes 15 and 86 are formed in both of two opposite side surfaces 55A. Though not illustrated, when the device plates 55 are laminated, the laminated chip package can be obtained by forming connection electrodes on the opposite two side surfaces. This laminated chip package has a both-side wiring structure in which the connection electrodes are formed on both of the opposite faces.

In the semiconductor wafer 112, the device region 10 is in contact with the groove portion 20 only in any one of right and left directions. Therefore, when the semiconductor wafer in which the groove portion is formed along every other scribe line as in the semiconductor wafer 112 is used, the end faces of the wiring electrodes appear only one of the side surfaces in the device plate. The other side surfaces are not covered by any resin.

What is claimed is:

1. A semiconductor substrate having a plurality of groove portions formed along scribe lines, comprising:
    a device region in contact with at least any one of the plurality of groove portions and having a semiconductor device formed therein;
    a surface insulating layer formed to cover the device region and constituting a surface layer of the semiconductor substrate;
    a wiring electrode connected to the semiconductor device and formed in a protruding shape rising above an outer surface of the surface insulating layer; and
    an in-groove insulating portion formed inside the groove portions,
    wherein the outer surface of the surface insulating layer and a surface of the in-groove insulating portion are substantially parallel throughout an upper surface of the device region arranged near the wiring electrode,
    the surface insulating layer is disposed at the outermost position of the semiconductor substrate, except at portions where the wiring electrodes are formed, and
    a plurality of the wiring electrodes are arranged along at least any one of the plurality of groove portions and form a wiring electrode group having an unevenly distributed structure in which extended terminal portions thereof are unevenly extended at a part of all of the groove portions in contact with the device region.

2. The semiconductor substrate according to claim 1, wherein the wiring electrode has a cross side surface projecting outward from the surface of the surface insulating layer and crossing with the surface of the surface insulating layer, a top end face projecting outward from the surface of the surface insulating layer and disposed along the surface of the surface insulating layer, and an embedded portion embedded inward from the surface of the surface insulating layer.

3. The semiconductor substrate according to claim 1, further comprising:
    a connecting pad connected to the semiconductor device; and
    a protecting insulating layer having a connecting hole formed at a position for forming the connecting pad, the protecting insulating layer being disposed under the surface insulating layer and formed to cover the device region,
    wherein the wiring electrode has an electrode pad having an expanded height from a side outer than the surface of the surface insulating layer to the connecting pad.

4. The semiconductor substrate according to claim 1, wherein an end face of the wiring electrode appears projecting outward from the surface of the surface insulating layer at a cut surface when the semiconductor substrate is cut along at least any one of the plurality of groove portions.

5. The semiconductor substrate according to claim 1, wherein the wiring electrode has an extended terminal portion that is substantially parallel throughout the upper surface of the device region.

6. A semiconductor substrate having a plurality of groove portions formed along scribe lines, comprising:
    a device region in contact with at least any one of the plurality of groove portions and having a semiconductor device formed therein;
    a surface insulating layer formed to cover the device region and constituting a surface layer of the semiconductor substrate; and
    a wiring electrode connected to the semiconductor device and formed in a protruding shape rising above an outer surface of the surface insulating layer,
    wherein the surface insulating layer is structured integrally with an in-groove insulating portion formed inside the groove portion,
    the wiring electrode has an extended terminal portion extended from the device region to an area above the groove portion and formed in a protruding shape rising above an outer surface of the in-groove insulating portion,
    the groove portions are entirely filled with the in-groove insulating portion portion, and
    a plurality of the wiring electrodes are arranged along at least any one of the plurality of groove portions and form a wiring electrode group having an unevenly distributed structure in which the respective extended terminal portions thereof are unevenly extended at a part of all of the groove portions in contact with the device region.

7. The semiconductor substrate according to claim 6, wherein the extended terminal portion has a cross side surface projecting outward from the surface of the surface insulating layer and crossing with the surface of the surface insulating layer, and a top end face projecting outward from the surface of the surface insulating layer and disposed along the surface of the surface insulating layer.

8. The semiconductor substrate according to claim 7, further comprising:
    a connecting pad connected to the semiconductor device; and
    a protecting insulating layer having a connecting hole formed at a position for forming the connecting pad, the protecting insulating layer being disposed under the surface insulating layer and formed to cover the device region,
    wherein the wiring electrode has an electrode pad having an expanded height higher than the surface of the surface insulating layer above the connecting pad.

9. The semiconductor substrate according to claim 6, wherein the extended terminal portion is not in contact with another conductive part in an area above the groove portions.

10. A semiconductor substrate having a plurality of groove portions formed along scribe lines, comprising:
    a device region in contact with at least any one of the plurality of groove portions and having a semiconductor device formed therein;

a surface insulating layer formed to cover the device region and constituting a surface layer of the semiconductor substrate; and a wiring electrode connected to the semiconductor device and formed in a protruding shape rising above an outer surface of the surface insulating layer;

wherein the surface insulating layer is structured integrally with an in-groove insulating portion formed inside the groove portion, the wiring electrode has an extended terminal portion extended from the device region to an area above the groove portion and formed in a protruding shape rising above an outer surface of the in-groove insulating portion, and a plurality of the wiring electrodes are arranged along at least any one of the plurality of groove portions and form a wiring electrode group having an unevenly distributed structure in which the respective extended terminal portions thereof are unevenly extended at a part of all of the groove portions in contact with the device region.

* * * * *